(12) United States Patent
Shu et al.

(10) Patent No.: US 9,412,440 B1
(45) Date of Patent: *Aug. 9, 2016

(54) SYSTEMS AND METHODS OF PIPELINED OUTPUT LATCHING INVOLVING SYNCHRONOUS MEMORY ARRAYS

(71) Applicant: GSI TECHNOLOGY, INC., Sunnyvale, CA (US)

(72) Inventors: Lee-Lean Shu, Los Altos, CA (US); Yoshinori Sato, San Jose, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,001

(22) Filed: May 26, 2015

Related U.S. Application Data

(63) Continuation of application No. 14/203,416, filed on Mar. 10, 2014, now Pat. No. 9,053,768.

(60) Provisional application No. 61/786,096, filed on Mar. 14, 2013.

(51) Int. Cl.

| | |
|---|---|
| *G11C 7/22* | (2006.01) |
| *G11C 11/4076* | (2006.01) |
| *G11C 7/06* | (2006.01) |
| *G11C 7/08* | (2006.01) |
| *G11C 11/419* | (2006.01) |
| *G11C 7/10* | (2006.01) |
| *G11C 11/4096* | (2006.01) |

(52) U.S. Cl.
CPC ............ *G11C 11/419* (2013.01); *G11C 7/1066* (2013.01); *G11C 7/106* (2013.01); *G11C 7/1051* (2013.01); *G11C 7/22* (2013.01); *G11C 7/222* (2013.01); *G11C 11/4076* (2013.01); *G11C 11/4096* (2013.01); *G11C 2207/2272* (2013.01)

(58) Field of Classification Search
CPC .. G11C 7/1066; G11C 11/4076; G11C 7/222; G11C 7/1051; G11C 11/4096; G11C 7/106; G11C 7/22; G11C 2207/2272
USPC ............. 365/154, 207, 189.05, 233.13, 233.1
See application file for complete search history.

(56) References Cited

U.S. PATENT DOCUMENTS

| | | | |
|---|---|---|---|
| 5,969,986 A | * 10/1999 | Wong | ................ G11C 7/1039 365/185.03 |
| 6,262,937 B1 | 7/2001 | Arcoleo et al. | |
| 6,504,417 B1 | 1/2003 | Cecchi et al. | |
| 6,744,277 B1 | 6/2004 | Chang et al. | |
| 6,882,237 B2 | 4/2005 | Singh et al. | |

(Continued)

*Primary Examiner* — Ly D Pham
(74) *Attorney, Agent, or Firm* — DLA Piper LLP (US)

(57) ABSTRACT

Systems and methods of synchronous memories and synchronous memory operation are disclosed. According to one illustrative implementation, a memory device is disclosed comprising memory circuitry having a memory output, the memory circuitry including a sense amplifier having a first output and a second output, a first data path coupled to the first output of the sense amplifier, the first data path including 2 latches/registers, and a second data path coupled to the second output of the sense amplifier, the second data path including a plurality latches/registers. In further implementations, various control circuitry, connections and control signals may be utilized to operate the latches/registers in the first and second data paths according to specified configurations, control, modes, latency and/or timing domain information, to achieve, for example, pipelined output latching and/or double data rate output.

20 Claims, 20 Drawing Sheets

(56) References Cited

U.S. PATENT DOCUMENTS

| | | |
|---|---|---|
| 6,954,091 B2 | 10/2005 | Wurzer |
| 7,002,404 B2 | 2/2006 | Gaggl et al. |
| 7,042,271 B2 | 5/2006 | Chung et al. |
| 7,095,287 B2 | 8/2006 | Maxim et al. |
| 7,142,477 B1 | 11/2006 | Tran et al. |
| 7,152,009 B2 | 12/2006 | Bokui et al. |
| 7,848,725 B2 | 12/2010 | Zolfaghari et al. |
| 8,044,724 B2 | 10/2011 | Rao et al. |
| 9,053,768 B2 * | 6/2015 | Shu .................. G11C 7/106 |
| 2004/0169565 A1 | 9/2004 | Gaggl et al. |
| 2005/0024912 A1 * | 2/2005 | Chen .................. G11C 29/846 365/145 |
| 2005/0186930 A1 | 8/2005 | Rofougaran et al. |
| 2006/0139105 A1 | 6/2006 | Maxim et al. |
| 2008/0068096 A1 | 3/2008 | Feng et al. |

* cited by examiner

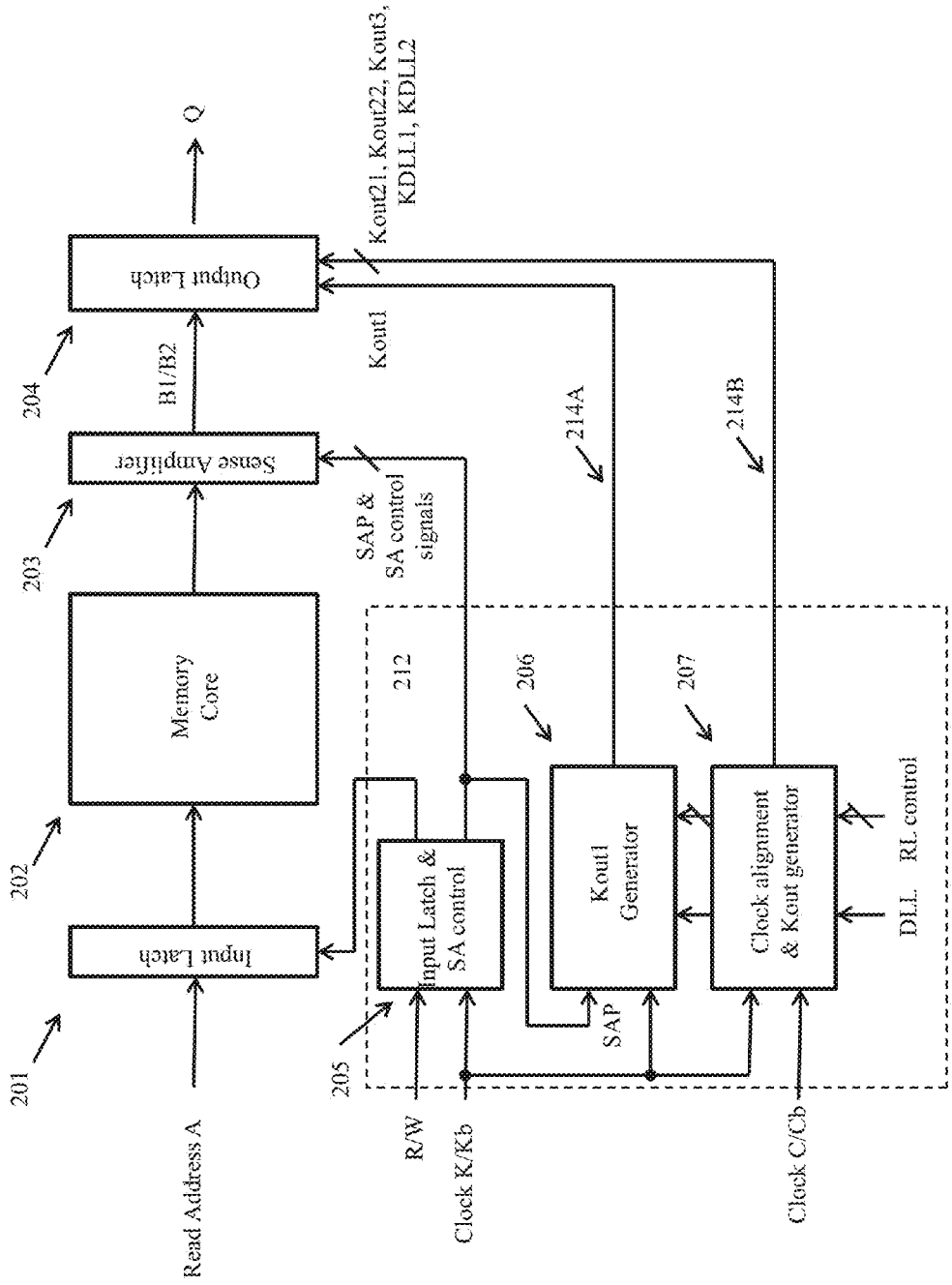

Output Latch with SDR

Latch is transparent when the control is high

| Kout vs RL | 1.5 | 2.0 | 2.5 | 3.0 | 3.0+ | DLL=0 (RL=1.0) |
|---|---|---|---|---|---|---|
| Kout1 | Kb delay | SA tracked 1 shot | SA tracked 1 shot | SA tracked 1 shot | SA tracked 1 shot | K 1 shot |
| Kout21 | C_DLL 1 shot delay | 1 | K_DLL 1 shot delay | K_DLL 1 shot delay | K 1 shot delay | 1 |
| KDLL1 | Cb_DLL 1 shot | K_DLL 1 shot | Kb_DLL 1 shot | K_DLL 1 shot | K 1 shot | K 1 shot + |

Clock Alignment 207

SYSTEMS AND METHODS OF PIPELINED OUTPUT LATCHING INVOLVING SYNCHRONOUS MEMORY ARRAYS

CROSS-REFERENCE TO RELATED APPLICATION

This is a continuation of application Ser. No. 14/203,416, filed Mar. 10, 2014, publication No. 2014/0286083A1, now U.S. Pat. No. 9,053,768, which claim the benefit/priority of provisional application No. 61/786,096, filed Mar. 14, 2013, all of which are incorporated herein by reference in entirety.

BACKGROUND

1. Field

Aspects of the present innovations relate to or involve output latching and/or memory operation, such as pipelined output latching circuitry/schemes for high transaction rate synchronous memory.

2. Description of Related Information

A requirement of certain systems and environments such as current networking equipment is the use of high speed memory that accepts address input at high frequency, while allowing a slower access time in comparison. For example, a conventional SRAM running at 714 MHz with two addresses accepts one read address and one write address on every clock cycle. However, the read output may be required only on the third clock, and is referred to as a read latency of RL=3. Once the RL is satisfied on the first access, continuous output occurs for subsequent cycles in response to address inputs. The conventional memory may also employ a double data rate (DDR) data scheme, such that every clock cycle will have two pieces of data, with one aligned on the positive clock edge and the other aligned on the negative clock edge. Higher clock frequency provides a faster address rate, thereby allowing RL to be increased in value.

A conventional design is shown in FIG. 1 where the output path includes two data paths. The two data paths receive the data B1 and B2 from sense amplifier SA at the same time to shift the data to the output. An address request is received on every external clock cycle. Therefore, the sense amplifier SA produces B1 and B2 data every clock cycle in response to the external address. The output Q generated from B1 and B2 data can be produced at any of 1, 1.5, 2, 2.5 or 3 clock cycles later, according to the read latency RL, in response to the external address. However, the data needs to be changed every clock cycle. The output Q is provided in DDR format, with the first half cycle including data B1 and the second half cycle including data B2. Data B1 is shifted through a register Reg clocked by clock K and then by clock Kb if RL is 2.5 or directly to the final latch if the RL is 2.0 or lower.

With regard to some of the signals illustrated in FIG. 1, KDS and complementary KDS (/KDS) are data strobe signals generated by K and Kb, respectively. RE is the read enable signal that drives the sense amplifier output during certain times. CKout1 is a pulse signal to the output clock buffer in the first data path to enable B1 outputs, and CKout2 is a pulse signal to the output clock buffer in the second data path to enable B2 outputs. SEL is the select signal that is set low for SQ1, SQ2 and SQ2+(read latency of 2 clocks), and high for SQ2+(read latency of 2.5 clocks).

The clock K is generated from an external clock CLK and clock Kb is the inverse of clock K. Data B2 of output Q is half cycle later than B1, so one additional register Reg that is clocked by the next half clock is needed to account for the half cycle shift. The final stage is formed by a pass gate for each B1 and B2 data path, and is clocked by DLL (Delayed Lock Loop) or PLL (Phase Locked Loop) clocks and then wired "OR" with a latch to be multiplexed to the output Q. The DLL or PLL clocks CKout1 and CKout2 are generated by a DLL or a PLL circuit to align the output Q to the external clock's high and low edges. For example, when RL=2.0, CKout1 aligns data B1 to clock CLK on the second CLK high edge after the address is received; and CKout2 aligns the data B2 a half clock later on the second CLK low edge. As RL is increased, the number of registers provided in series increases in the read data path and the registers are strobed by the clock edges.

Such conventional schemes have several drawbacks, however. First, the memory access cycle time is limited by the clock K in the first output register Reg. The added read latency does not improve the clock frequency. Second, if the clock K in the first output register is delayed to improve the clock frequency, then clock Kb of the second register also needs to be delayed. Consequently, the delay of Kb can delay output Q and the delay itself is difficult to optimize. Third, any additional series register(s) undesirably increases the overall access delay.

In sum, there is a need for systems and methods that provide higher transaction rate synchronous memory, utilize less registers and delay in the data paths, and/or otherwise overcome existing drawbacks such as clock delays in output register chains as well as limitations regarding access delay time and/or memory access cycle time.

BRIEF DESCRIPTION OF THE DRAWINGS

The accompanying drawings, which constitute a part of this specification, illustrate various implementations and aspects of the innovations herein and, together with the description, help illustrate aspects of the present innovations. In the drawings:

FIG. 2A is a block diagram of memory chip illustrative pipelined output latch features of exemplary memory devices consistent with one or more aspects of the innovations herein.

DETAILED DESCRIPTION OF ILLUSTRATIVE IMPLEMENTATIONS

Figure 1:
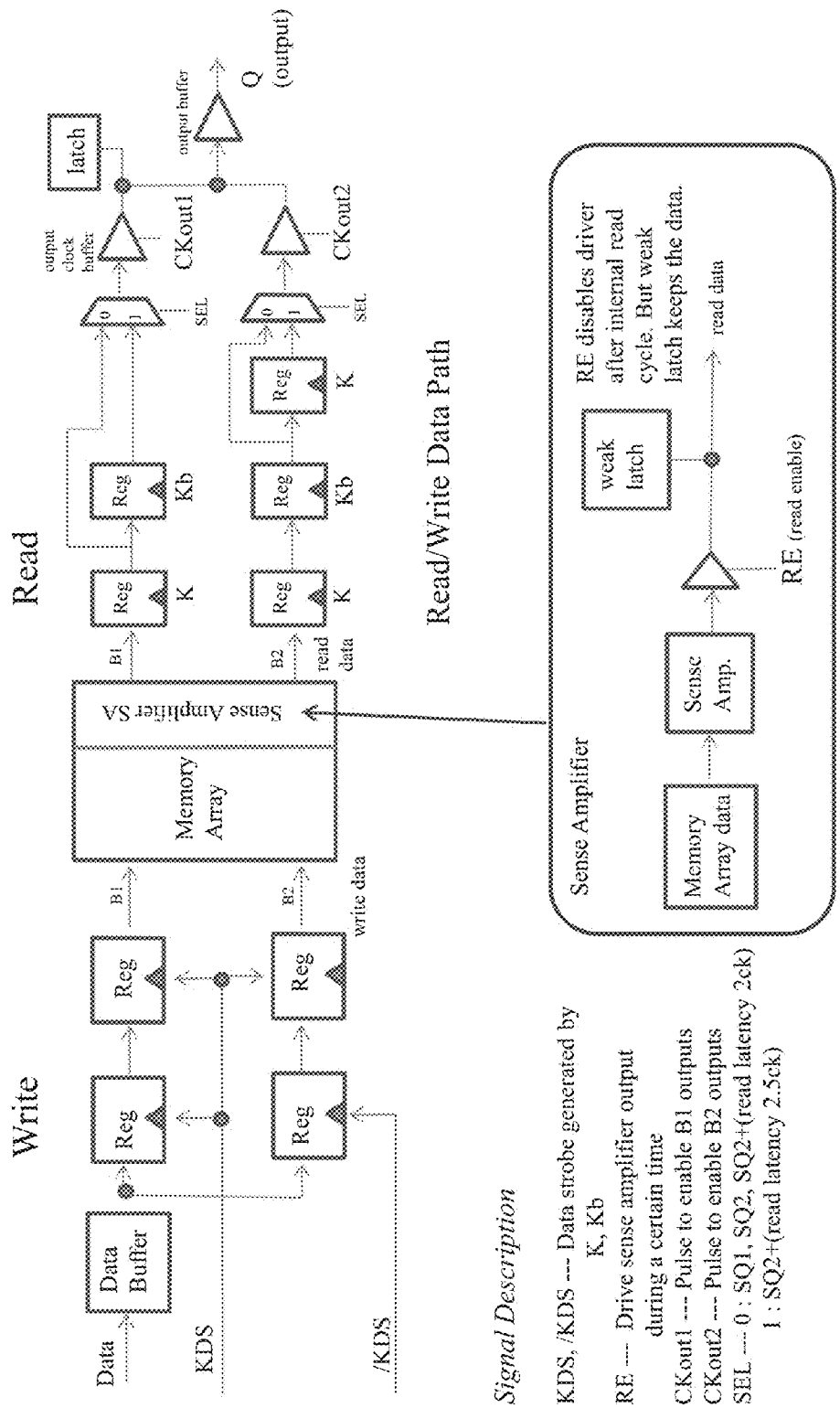
FIG. 1 is a block diagram of a read/write data path for a memory array.

Reference will now be made in detail to the innovations herein, examples of which are illustrated in the accompanying drawings. The implementations set forth in the following description do not represent all implementations consistent with the present inventions. Instead, they are merely some examples consistent with certain aspects related to the present innovations. Wherever possible, the same reference numbers will be used throughout the drawings to refer to the same or like parts.

Various systems and environments utilize high speed synchronous memory such as SRAM with particular output latch circuitry designed to accept address input at high frequency. Aspects of the present innovations relate to or involve output latching and memory, such as pipelined output latching and schemes for high transaction rate synchronous memory that accept address input at high frequency, while allowing a slower access time in comparison.

FIG. 2A illustrates a representative memory chip including exemplary output latch/register circuitry consistent with one or more aspects of the innovations herein. In the illustrative implementation shown, external read address A is latched by Input Latch 201 and then sent to memory core 202. The data from the memory core 202 is accessed and sent to Sense Amplifier SA 203. SA 203 then generates B1 and B2 data in parallel and sends to output Latch 204. Output Latch 204 receives B1 and B2 data and arranges the data in DDR data format with the read latency defined by the RL control signals and sends it out as output Q. Input Latch & SA control 205 receives external RAN (Read/Write control) and K and Kb clocks to generate input latch control signals to latch read address A on every external clock edge K. Input Latch & SA Control 205 also generates a Sense Amplifier pre-charge signal SAP and Sense Amplifier control signals for Sense Amplifier operation. Kout1 Generator 206 receives the SAP signal and external K/Kb signals to generate Kout1 to latch B1 and B2 data from the SA 203. The clock alignment & Kout generator 207 receives external K and Kb clocks and external C and Cb clocks to generate KDLL1, KDLL2, Kout2 and Kout3 signals to operate Output Latch 204. Generator 207 may include clock alignment circuitry such as a Delayed Lock Loop (DLL) circuit to generate signals such as KDLL1 and KDLL2 to align the Q output to the external clock edge K and Kb, or C and Cb, depending on the read latency. Alternatively or in addition, the clock alignment circuitry may include a Phase Lock Loop (PLL) circuit. The DLL signal is an external mode pin to activate DLL or PLL circuit. When DLL=1, DLL or PLL is activated and Q is aligned to the external clock edges. When DLL=0, DLL or PLL is de-activated and Q is delayed by the propagation delay of latch 204 and generator 207. The RL control signal controls Q output's read latency RL from 1.0 to 3.0. DLL and RL control are sent to both generators 206 and 207 for mode control.

Figure 2B:
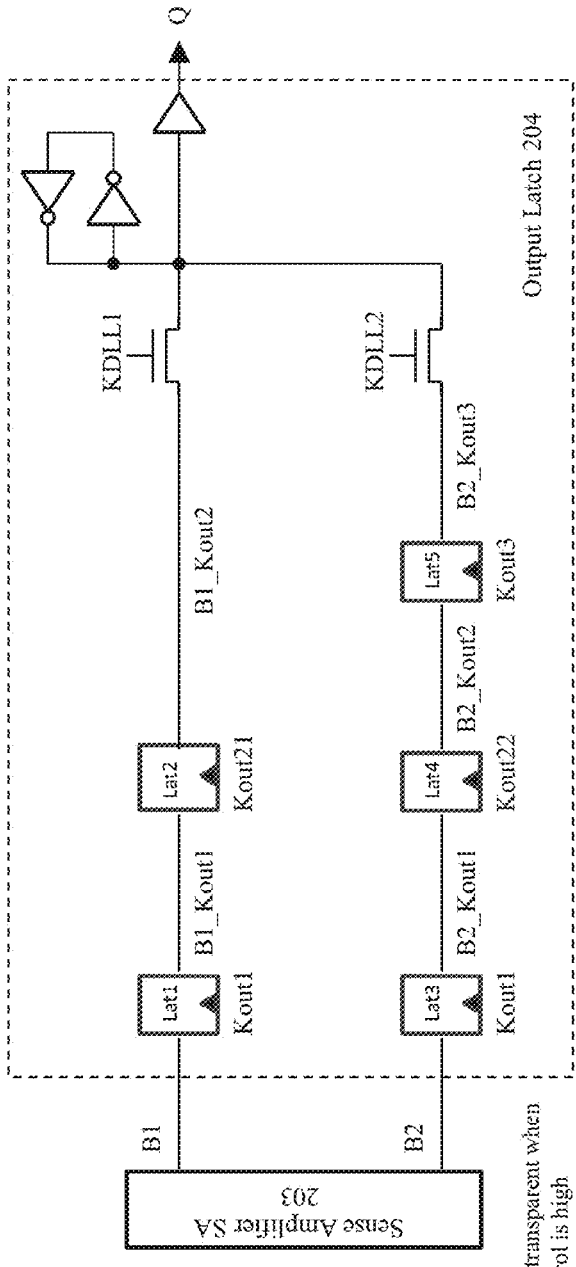
FIG. 2B is a block diagram of illustrative pipelined output latch features of exemplary memory devices consistent with one or more aspects of the innovations herein.

FIG. 2B depicts some exemplary details of illustrative Output Latch 204 circuitry, such as shown in FIG. 2A, consistent with one or more aspects of the innovations herein. The representative circuitry shown in FIG. 2B illustrates two data paths B1 and B2 having a final stage of pass gates clocked by KDLL1 and KDLL2, a wired "OR" with a latch to be multiplexed to the Q output. B1 and B2 are two data output from SA 203 corresponding to two DDR data on each output. On each K cycle with read asserted, B1/B2 of a previous cycle are held until pre-charged of the sensing, then valid data of the current cycle is output after the sensing is completed. During the period of pre-charge, B1/B2 can be latched to maintain the values of the previous cycle. The timing of B1/B2 of the previous cycle changes to the valid data of the current cycle can be extended to the next cycle, or next 2 cycles. KDLL1 and KDLL2 are generated by a DLL or a PLL circuit to align the output Q to the external complementary clocks' high edges with KDLL1 to strobe the first DDR data and KDLL2's phase shifted by a half cycle to strobe the second DDR data, similar to CKout1 and CKout2 in FIG. 1. For example, in the case of RL=3, KDLL1 and KDLL2 are one shot pulses controlling two latches with a multiplexer where B1_Kout2 is multiplexed to Q aligned on the rising edge of external clock K and B2_Kout3 is multiplexed to Q half cycle later. The latch can be converted to a register by adding a latch in front with inverted control signal. For example, the KDLL1 latch can add a latch in front that is controlled by the inverse of KDLL1 signal to form a register where the data is shifted on the KDLL1 rising edge. In FIG. 2B, latches are provided prior to the final pass gate stage so the sense amplifier SA 203 data can be sent to the output without a gating delay by clock K. The configuration in FIG. 2B applies to RL up to 3.0 and is formed by two latches Lat1, Lat2 in the B1 data path and three latches Lat3, Lat4, Lat5 in the B2 data path prior to the final pass gate stage. The respective first latch Lat1, Lat3 of the B1 and B2 paths receives sense amplifier 203 data controlled by clock Kout1. The second latch Lat2 of the B1 data path is controlled by a clock Kout21 and the second latch Lat4 of B2 is controlled by Kout22. It should be noted that clock Kout21 and Kout22 are generated with the same timing except in the case where RL=2.0, Kout21 is biased high. The third latch Lat5 of B2 is controlled by clock Kout3. Clocks Kout21, Kout22 and Kout3 are all generated from the DLL or PLL timing circuit 207, same timing domain as KDLL1 and KDLL2, while Kout1 is generated from clock K timing domain of Kout1 generator 206. The DLL or PLL timing circuit 207 generates K_DLL and Kb_DLL signals, and in turn generates one shot signals of KDLL1 and KDLL2. K_DLL and Kb_DLL have the same frequency of K and Kb and have around 50% duty cycle. K_DLL is used to align Q to the rising edge of K and Kb_DLL is used to align Q to the rising edge of Kb, the complement clock of K. When RL is 3.0 or 2.0, KDLL1 is generated from K_DLL and KDLL2 is generated from Kb_DLL. When RL=1.5 or 2.5, KDLL1 and KDLL2 are reversed, and are generated from Kb_DLL and K_DLL, respectively. Note that K_DLL and Kb_DLL can also be implemented from only one clock edge, say K_DLL from the K clock edge and then Kb_DLL is derived with a half cycle shift through the DLL or PLL circuit 207, instead of the Kb clock signal. Except at RL=2.0, Kout21 and Kout22 are one shot pulses from the 1 shot pulse generated from K_DLL. The rising edge is from the K_DLL 1 shot pulse's falling edge, and the falling edge is self timed such that it is before the next cycle's Kout1 rising, and is better to be at or later than the current Kout1's falling edge. Kout21 and Kout22 are basically the same except at RL=2.0, Kout21=1 while Kout22 is toggling and has the same timing of KDLL1. Lat5 is the $3^{rd}$ latch in the B2 path, and is required to latch B2_Kout2 to B2_Kout3 with the control of Kout3. In RL=2.0 and lower, Lat5 is not needed and Kout3 is biased high. For RL=2.5 or higher, Kout21 and Kout22 have the same timing, so are B1_Kout2 and B2_Kout2, therefore Kout3 latching function is same as KDLL1's in the B1 path. KOUT3 timing is same as KDLL1 to latch B2_Kout3. B2_Kout3 is valid for nearly a whole cycle and KDLL2 with timing half cycle behind KDLL1, can strobe it for $2^{nd}$ DDR Q output. For RL=2.0, Lat5 is biased high and Lat4 is the last latch before the multiplexer. Lat2 is also biased high, B1_Kout2 is connected to B1_Kout1 and has the same timing as B2_Kout1. Therefore Kout22 has the same latching timing as KDLL1. The last latch controlled by KDLL2 can be replaced by register with the same control timing.

Circuit operation at high frequency is referred to as fast cycle, while low frequency circuit operation is referred to as slow cycle. Read latency must be satisfied on both fast and slow cycles. Clocks Kout1-Kout3 operate differently based on the RL value. Operation with respect to RL values from 1.0 to 3.0 will be discussed in detail below.

Figure 3A:
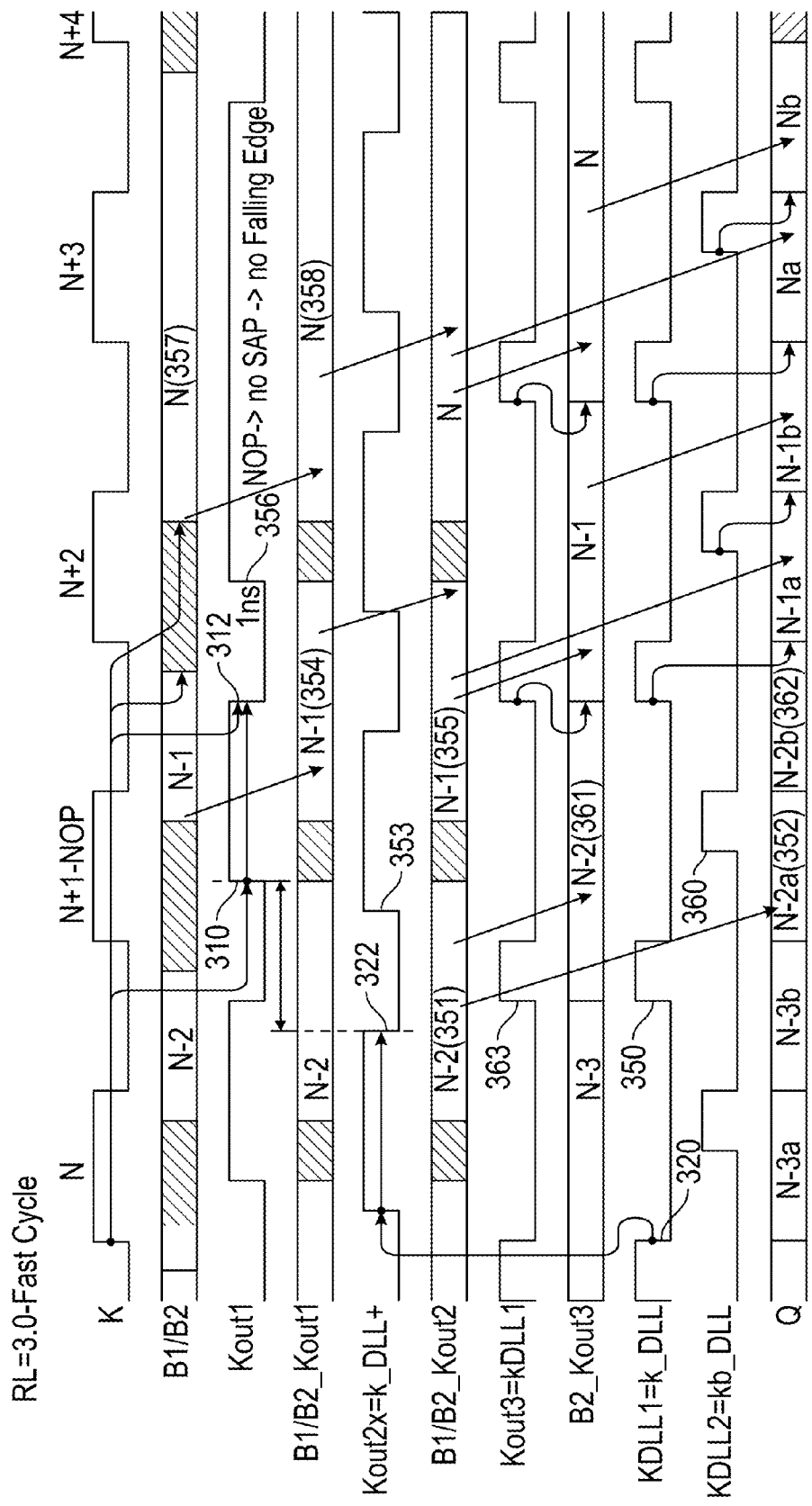
FIGS. 3A-3B are illustrative timing diagrams of RL=3.0 consistent with one or more aspects of the innovations herein.
Figure 3B:
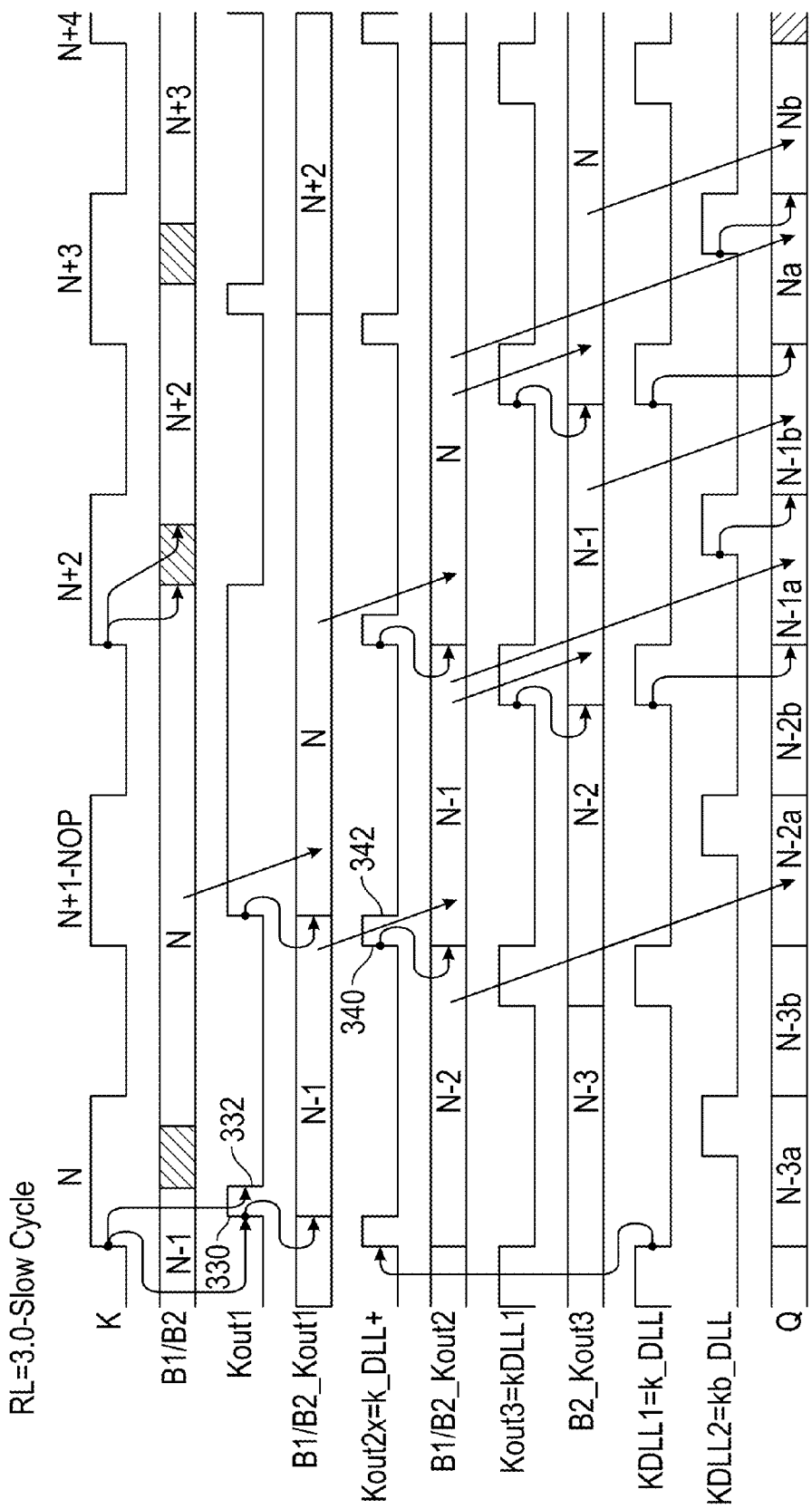

FIGS. 3A-3B are illustrative timing diagrams of RL=3.0 consistent with one or more aspects of the innovations herein. Referring to the representative implementation of FIG. 3A, one illustrative fast cycle operation is shown. In this exemplary fast cycle, Kout1 is the clock generated by tracking sense amplifier SA 203 pre-charge timing SAP. Kout1 functions to shift the data by one clock cycle and latch sense amplifier SA 203 data at a maximum timing window. The sense amplifier SA 203 is operated by sensing memory array data every cycle and outputting valid data after sensing. The sensing may be started by pre-charging the output B1 and B2 to a pre-charged state, as 0, or 1 or latched to stay as the present data, and then changing to a valid data value of either 1 or 0 after sensing. Here, the data is then held until the next sensing cycle. In the case of pre-charged state of either 0 or 1, the exemplary sense amplifier SA 203 pre-charge time SAP consumes approximately 15% of the total access time, so the data valid time consumes approximately 85% of the total flow through access time. The total flow through access time is referred to the access time from the rising edge of K when the read address is latched to the time of $1^{st}$ DDR data of Q output with all output latches of B1 path are biased high. Kout1 tracks the SA pre-charge time SAP to provide latching with the maximum SA data valid window available. When RL=3.0, the total flow through access time allowed is three clock cycles, the SA pre-charge time occupies approximately 15% of three cycles, which equals approximately 45% of one clock cycle. Consequently, 55% of the cycle time is available for sense amplifier SA 203 data to be latched. In the case of pre-charge state to be maintained the same as previous cycle, then near 100% of the cycle time is available for sense amplifier SA 203 data to be latched. For ease of discussion SAP will refer to restricted case of pre-charged states being either 0 or 1. However, innovations herein may also utilize the pre-charged state as the latched state with the pre-charged timing treated the same as the valid data timing and Kout1 timing can be extended to the data sensing timing.

The falling (trailing) edge 312 of Kout1 is triggered from the SA pre-charge clock SAP of output of 205 to latch the B1/B2 data of the previous cycle N−1, and the rising (beginning) edge 310 is the delay from clock K to form a one shot pulse. Because both rising edge 310 and falling edge 312 are generated from clock K, the high pulse width can be controlled. Kout1 preferably generates a rising edge earlier so B1 data can pass through the latches to Q output to make latency limitation.

Take, for example, an address access time of 4.5 ns under poor operating conditions of low VDD and high temperature. The fastest cycle time that can be achieved with RL=3.0 is address access time divided by 3, or 1.5 ns. A SA pre-charge time is 2.9 ns and a SA valid time is 3.6 ns. Therefore, the subsequent cycle's SA pre-charge time is 4.4 ns, equal to 2.9 ns+1.5 ns. The Kout1 falling edge 312 is provided at 4.4 ns with the SA pre-charge clock SAP and the rising edge 310 at approximately 3.4 ns. Based on these values, Kout1 has a high pulse width of 1 ns (4.4 ns-3.4 ns) and a low pulse width of 0.5 ns, determined as the balance of the high pulse width. Note that the timing of the rising edge is not critical, so long as enough time is provided for B1 data to flow through and both the high and low pulse widths are wide enough to be recognized by the Kout1 latch. In according with this illustrative timing model, here, notice that the SA data may be latched at 4.4 ns with the cycle time of 1.5 ns, or close to the end of the $3^{rd}$ cycle. This way, the SA data can be latched around the end of last cycle ($3^{rd}$ cycle with RL=3.0) and the clock cycle time is not limited by SA output latch. The clock cycle time can be pushed to the minimum that it is limited only by the address access time divided by RL, or read latency.

Referring again to FIG. 2A, K_DLL on one of the control lines 214B may be generated from control circuitry 212 such as clock alignment circuitry 207 associated with a DLL or PLL circuit to track clock K such that first DDR data of output Q is aligned to the K rising edge. Similarly, Kb_DLL (complementary K_DLL) is generated from the DLL or PLL clocking circuitry 207 to track Kb (complementary K) clock such that second DDR data of output Q is aligned to the Kb rising edge.

For RL=3.0, KDLL1 is based on K_DLL and KDLL2 is based on Kb_DLL. Kout21 is a self timed, one shot pulse generated from KDLL1 falling edge. Kout21 is provided a high pulse width which can be wider than a half cycle time of the fast cycle but with a falling edge 322 earlier than the rising edge 310 of Kout1. Falling edge 322 can be designed to be earlier than rising edge 310 because falling edge 322 is generated from KDLL1 which is related to the K rising edge, and rising edge 310 is also a tracking signal from the K rising edge, so the tracking relationship between the two edges can be built. Latch Lat2 can then latch B1_Kout1, the output of latch Lat1 and send the output B1_Kout2 to pass gate KDLL1. Because Kout21 is generated by the KDLL1 falling edge 320, B1_Kout2 is generated after pass gate KDLL1 is off and is held after the next cycle's KDDL1 off edge. B1_Kout2 therefore provides a large timing window for KDLL1 to strobe. Note that on the fast cycle, Kout1, Kout21 and KDLL1 may all be on at the same time for B1 to flow through all three latches from the sense amplifier SA 203 to output Q.

In summary, the Kout1 falling edge tracks the SA 203 delay to latch SA output and provides one cycle shift. The Kout21 falling edge tracks the next Kout1 rising edge to latch Lat1 output and provides a one cycle shift. The KDLL1 falling edge is ahead of the Kout21 rising edge to latch Lat2 output and provides one cycle shift. SA 203 data then flows through the three latches with RL=3. Kout3 has the same timing of KDLL1 then shifts B2_Kout3 nearly a cycle so it is available a half cycle later for $2^{nd}$ DDR data. In this manner, the clock cycle time is not limited by output latches and fastest clock cycle time can be achieved in accordance with the address access time divided by RL.

Referring to the exemplary implementation of FIG. 3B, one illustrative slow cycle operation is shown. Here, for example, on a slow cycle, B1 data is valid before the rising edge 330 of Kout1 and held after the Kout1 falling edge 332, and B1_Kout1 is ready before the rising edge 340 of Kout21 and held after the Kout21 falling edge 342 such that both latches Lat1 and Lat2 behave as registers with a two clock cycle shift. The KDLL1 latch serves as the third register for a three clock cycle shift.

Data B2 in the second data path is generated from sense amplifier SA 203 at the same time as data B1. The first two latches Lat 3 and Lat 4 of the B2 data path are similar to the ones of B1 path, with the third latch Lat 5 of Kout3 provided for a half cycle shift. Kout22 of the B2 path has the same timing as Kout21 of the B1 path. Kout3 has the same timing as KDLL1, and it shifts B2_Kout2 to B2_Kout3 by almost a full cycle, with plenty of timing for a half cycle shift. Accordingly, B2_Kout3 is multiplexed into the $2^{nd}$ DDR data of output Q.

Except with respect read latency RL=1.5 mode(s), and except with respect to KDLL2 always being a half cycle later than Kout3, the latching of the latter stage is always completed first before the earlier stage's latch open for new data. For example, as in FIG. 3A, Kout21 completes the latching of B1_Kout2 on edge 322 to N−2 before Kout1 updates B1_Kout1 on edge 310 to N−1. However, the latching of the earlier stage can overlap the beginning edge of the later stage. For example, Kout1's trailing (latching) edge can overlap the beginning edge of Kout21. Therefore, at the fast cycle, all latches in the path can all be on at the same time to allow data to flow through. However, in the slow cycle, the pipeline is established to allow for RL=3.0.

As in FIG. 2B, 3A, the timing sequence of Kout and KDLL is illustrated below, including the data latched in the cycles:

In the first (B1) data path, provide a KDLL1 (K 1 shot from DLL/PLL circuit) pulse 350 to latch cycle (N−2) data 351 from node B1_Kout2 to Q as $1^{st}$ part of output DDR data, (N−2)a 352, aligned to the rising edge of K at cycle (N+1).

As KDLL1 pulse 350 is completed, Kout21 pulse 353 is provided to latch cycle (N−1) data 354 from node B1_Kout1 to node B1_Kout2's data 355.

As Kout21 pulse 353 is completed, Kout1 pulse 356 is provided to latch cycle (N) data from SA output B1 357 to node B1_Kout1 358.

In the second (B2) data path, provide a KDLL2 (Kb 1 shot from DLL/PLL circuit) pulse 360 to latch cycle (N−2) data 361 from node B2_Kout3 to Q as $2^{nd}$ part of output DDR data, (N−2)b 362, aligned to the rising edge of Kb at the $2^{nd}$ half of cycle (N+1). Kb may be a complementary clock of K.

Kout3 pulse 363 is provided with the same timing as KDLL1, which is half cycle phase shifted before KDLL2. Therefore Kout3 363 is provided before KDLL2, to latch cycle (N−2) data from node B2_Kout2 351 to node B2_Kout3 361.

As Kout3 pulse 363 is completed, Kout22 pulse 353 is provided to latch cycle (N−1) data from B2_Kout1 354 to node B2_Kout2 355. Kout22 could have the same timing as Kout21.

As Kout22 353 is completed, Kout1 356 is provided to latch cycle (N) data from SA output B2 357 to node B2_Kout1 358.

The timing sequence described can also be described as below:
B1 path: KDLL1 (K_DLL 1 shot) pulse complete (N−2a) ⇒ Kout21 pulse complete (N−1) ⇒ Kout1 pulse complete (N).
B2 path: Kout3 pulse complete (N−2)⇒ KDLL2 (Kb_DLL 1 shot) pulse complete (N−2b) ⇒ Kout22 pulse complete (N−1) Kout1 pulse complete (N).

Figure 4A:
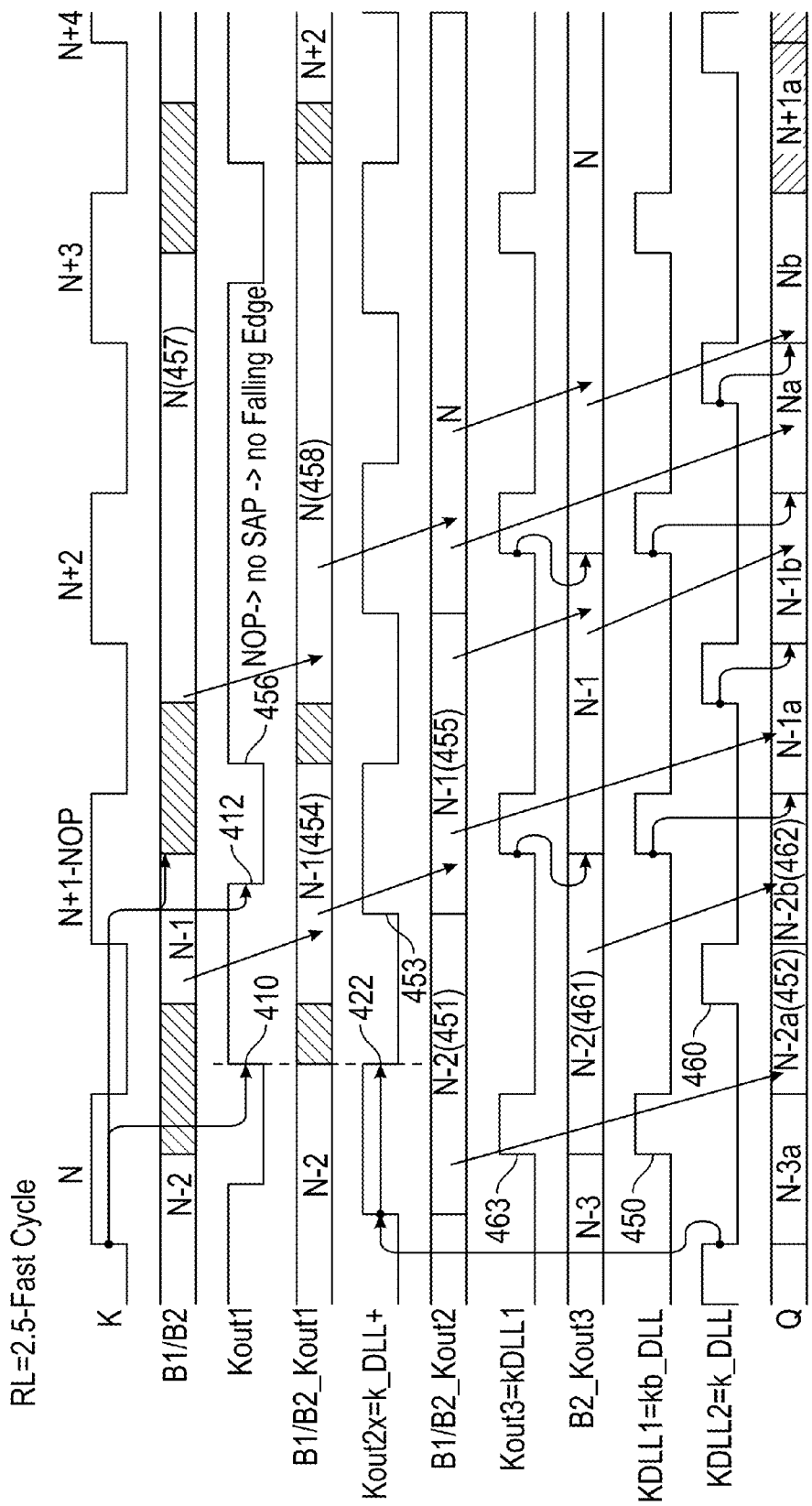
FIGS. 4A-4B are illustrative timing diagrams of RL=2.5 consistent with one or more aspects of the innovations herein.
Figure 4B:
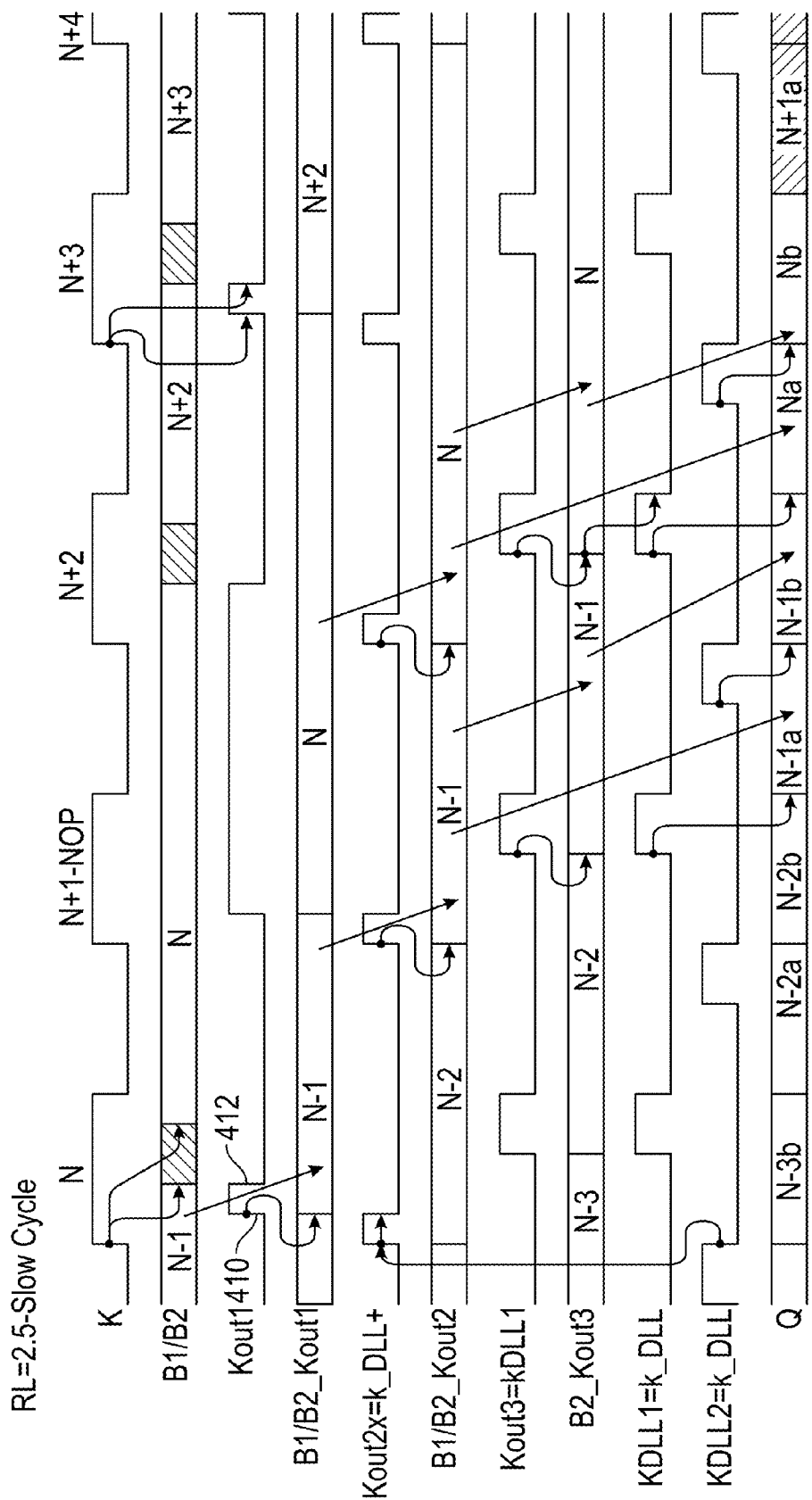

FIGS. 4A-4B are illustrative timing diagrams of RL=2.5 consistent with one or more aspects of the innovations herein. According to implementations consistent with FIGS. 4A-4B, when RL=2.5, the first DDR data of output Q is aligned to Kb, which is 2.5 cycles after Address, so KDLL1 is based on Kb_DLL. The second DDR of output Q is aligned to K, three cycles after Address, so KDLL2 is based on K_DLL. The latch operation of Kout1, Kout21, Kout22 are same as described with respect to RL=3.0, with KDLL1 and KDLL2 having an opposite phase of RL=3.0. For RL>=2.0, K_DLL is DLL clock generated from external K clock and Kb_DLL is DLL clock generated from external Kb clock. Also, Kout1 is a one shot pulse generated from K, same as for all RL>=2.0. The trailing edge 412 is from SA pre-charge clock SAP to track SA pre-charge delay. In this manner, Kout1 can latch SA data before it is changed. The beginning edge 410 is from K with delay such that Kout1 high pulse width can be maintained to be minimum pulse width. The falling edge 422 of Kout21 is designed to be earlier than the rising edge 410 of Kout1, so B1_Kout1 can be shifted to B1_Kout2, the same way as described in RL=3.0. Kout3 has same timing as KDLL1 and shifts B2_Kout2 to B2_Kout3 for KDLL2 half cycle later.

Similar to the implementations/configurations for RL=3.0, at the fast cycle, all latches in the path can all be on at the same time to allow data to flow through. However, in the slow cycle, the pipeline is established to allow for RL=2.5.

Similarly, for RL=3.0, sense amplifier data can be latched around the end of last cycle and the clock cycle time is not limited by output latches. The clock cycle time can be pushed to the minimum that it is limited only by the address access time divided by RL, or read latency.

In connection with the illustrative circuitry and timing diagrams of FIGS. 2B and 4A, an exemplary timing sequence of Kout and KDLL is set forth below, including the data latched in the cycles:

In the first (B1) data path, provide a KDLL1 (Kb 1 shot from DLL/PLL circuit) pulse 450 to latch cycle (N−2) data 451 from node B1_Kout2 to Q as $1^{st}$ part of output DDR data, (N−2)a 452, aligned to the rising edge of Kb at $2^{nd}$ half of cycle (N). Kb may be a complementary clock of K.

As KDLL1 pulse 450 is completed, Kout21 pulse 453 is provided to latch cycle (N−1) data 454 from node B1_Kout1 to node B1_Kout2's data 455.

As Kout21 pulse 453 is completed, Kout1 pulse 456 is provided to latch cycle (N) data from SA output B1 457 to node B1_Kout1 458.

In the second (B2) data path, provide a KDLL2 (K 1 shot from DLL/PLL circuit) pulse 460 to latch cycle (N−2) data 461 from node B2_Kout3 to Q as $2^{nd}$ part of output DDR data, (N−2)b 462, aligned to the rising edge of K at the cycle (N+1).

Kout3 pulse 463 is provided with the same timing as KDLL1, which is half cycle phase shifted before KDLL2. Therefore Kout3 463 is provided before KDLL2, to latch cycle (N−2) data from node B2_Kout2 451 to node B2_Kout3 461.

As Kout3 pulse 463 is completed, Kout22 pulse 453 is provided to latch cycle (N−1) data from node B2_Kout1 454 to node B2_Kout2 455. Kout22 could have the same timing as Kout21.

As Kout22 453 is completed, Kout1 456 is provided to latch cycle (N) data from SA output B2 457 to node B2_Kout1 458.

The timing sequence described can also be described as below:
B1 path: K DLL1 (Kb_DLL 1 shot) pulse complete (N−2a) ⇒ Kout21 pulse complete (N−1)⇒ Kout1 pulse complete (N).
B2 path: Kout3 pulse complete (N−2)⇒ KDLL2 (K_DLL 1 shot) pulse complete (N−2b) ⇒ Kout22 pulse complete (N−1)⇒ Kout1 pulse complete (N).

Figure 5A:
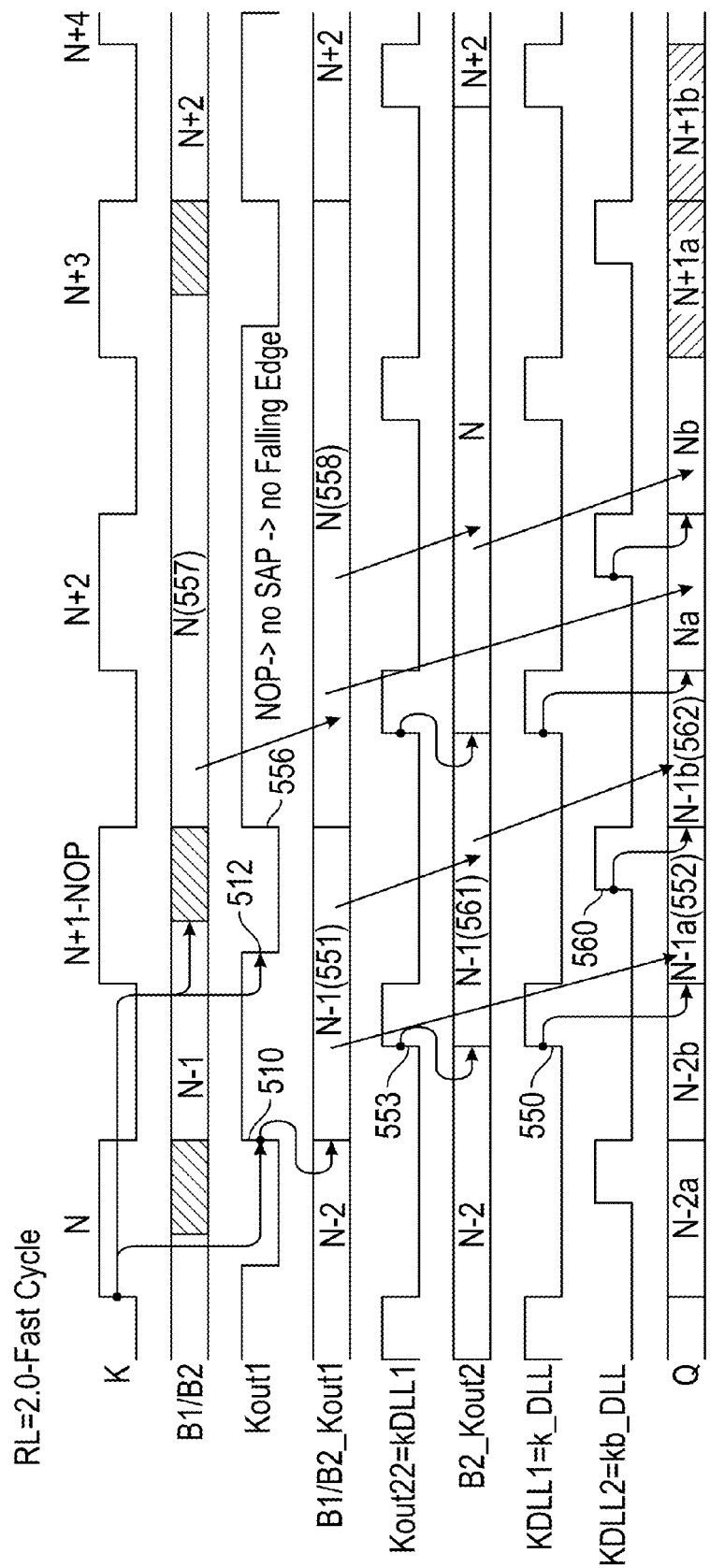
FIGS. 5A-5B are illustrative timing diagrams of RL=2.0 consistent with one or more aspects of the innovations herein.
Figure 5B:
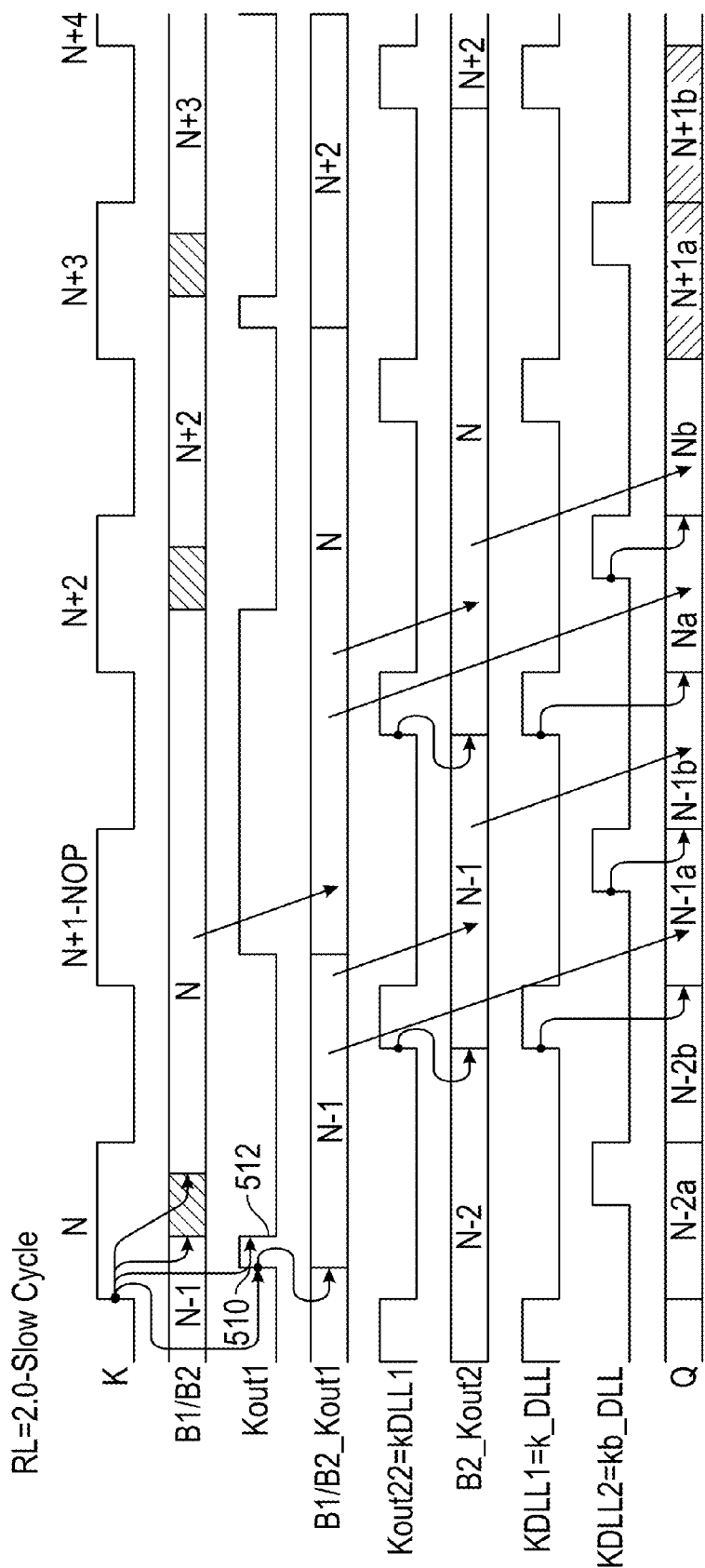

FIGS. 5A-5B are illustrative timing diagrams of RL=2.0 consistent with one or more aspects of the innovations herein. Here, for example, when RL=2.0, latches Lat2 and Lat5 are not required, so those two clocks are set to high for those two latches to be transparent. Latch Lat1 can hold its output B1_Kout1 from cycle one to cycle two, and allows KDLL1

(K_DLL 1 shot) to latch for RL=2.0. On the B2 data path, latch Lat4 can hold its output B2_Kout2 from cycle two to cycle three and allows KDLL2 (Kb_DLL 1 shot) to latch at 2.5 cycle. For RL=2.0, the Kout1 rising edge 510 can be earlier than RL=2.5 or 3.0 so that output Q can be at 2.0 clock cycle. The timing of B2_Kout1 is same as B1_Kout1 and B1_Kout2, therefore Kout22 timing is simply same as KDLL1. Because the trailing edge 512 of Kout1 is from the SA Pre-charge clock SAP, so at a non-read cycle, there is no SA pre-charge SAP to result in no Kout1 trailing edge 512.

Similar to the implementations/configurations for RL=3.0, at the fast cycle, all latches in the path can all be on at the same time to allow data to flow through. However, in the slow cycle, the pipeline is established to allow for RL=2.0.

Same as RL=3.0, SA data can be latched around the end of last cycle and the clock cycle time is not limited by output latches. The clock cycle time can be pushed to the minimum that it is limited only by the address access time divided by RL, or read latency.

As in FIG. 2B, 5A, the timing sequence of Kout and KDLL is illustrated below, including the data latched in the cycles:

In the first (B1) data path, provide a KDLL1 (K 1 shot from DLL/PLL circuit) pulse 550 to latch cycle (N−1) data 551 from node B1_Kout1 to Q as $1^{st}$ part of output DDR data, (N−1)a 552, aligned to the rising edge of K at cycle (N+1).

As KDLL1 pulse 550 is completed, Kout1 pulse 556 is provided to latch cycle (N) data from SA output B1 557 to node B1_Kout1 558.

In the second (B2) data path, provide a KDLL2 (Kb 1 shot from DLL/PLL circuit) pulse 560 to latch cycle (N−1) data 561 from node B2_Kout2 to Q as $2^{nd}$ part of output DDR data, (N−1)b 562, aligned to the rising edge of Kb at the $2^{nd}$ half of cycle (N+1). Kb may be a complementary clock of K.

Kout22 pulse 553 is provided with the same timing as KDLL1, which is half cycle phase shifted before KDLL2. Therefore Kout22 553 is provided before KDLL2, to latch cycle (N−1) data from node B2_Kout1 551 to node B2_Kout2 561.

As Kout22 553 is completed, Kout1 556 is provided to latch cycle (N) data from SA output B2 557 to node B2_Kout1 558.

The timing sequence described can also be described as below:
B1 path: KDLL1 (K_DLL 1 shot) pulse complete (N−1a) Kout1⇒ pulse complete (N).
B2 path: Kout22 pulse complete (N−1) ⇒ KDLL2 (Kb_DLL 1 shot) pulse complete (N−1b)⇒ Kout1 pulse complete (N).

FIGS. 6A-7B are illustrative timing diagram of RL=1.5 consistent with one or more aspects of the innovations herein.

Figure 6A:
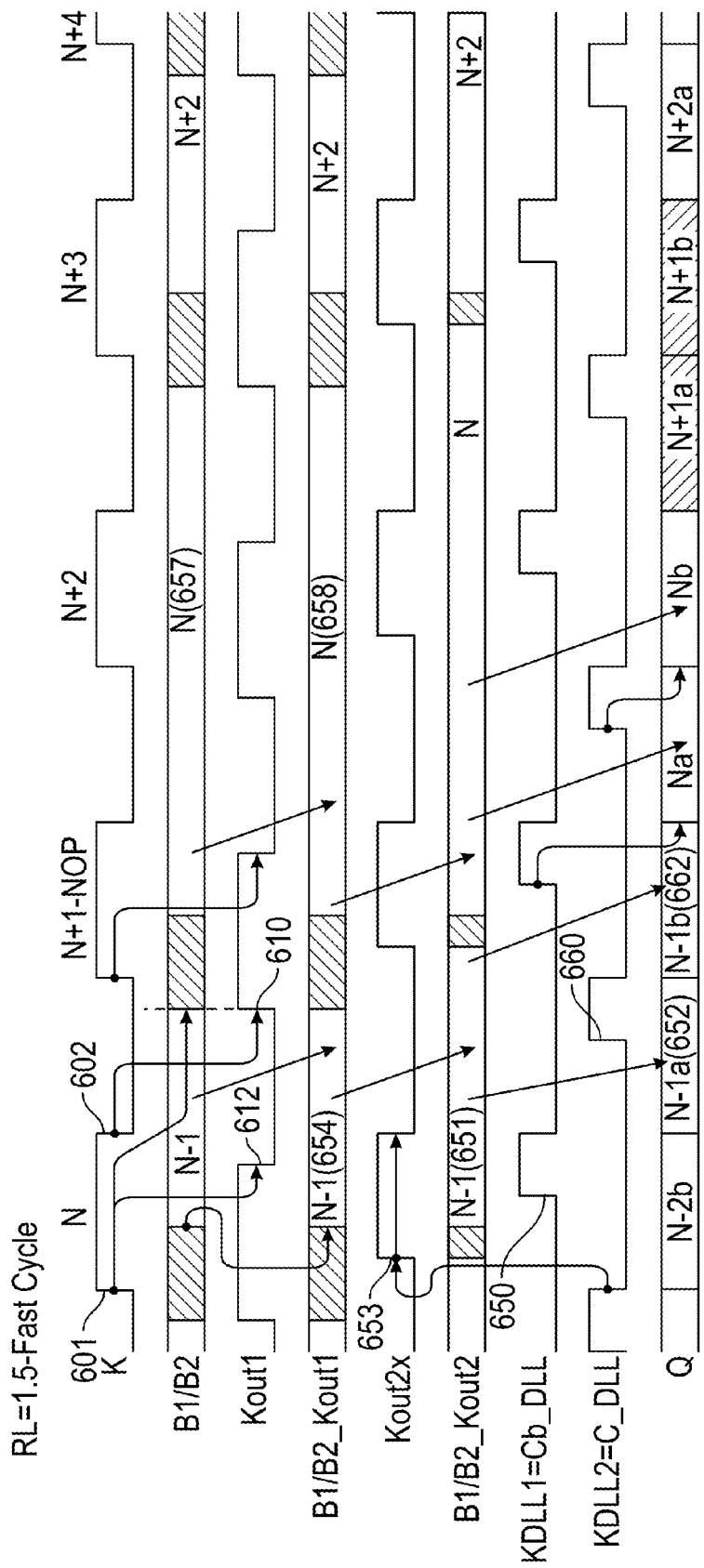
FIGS. 6A-6B are illustrative timing diagram of RL=1.5 consistent with one or more aspects of the innovations herein.
Figure 6B:
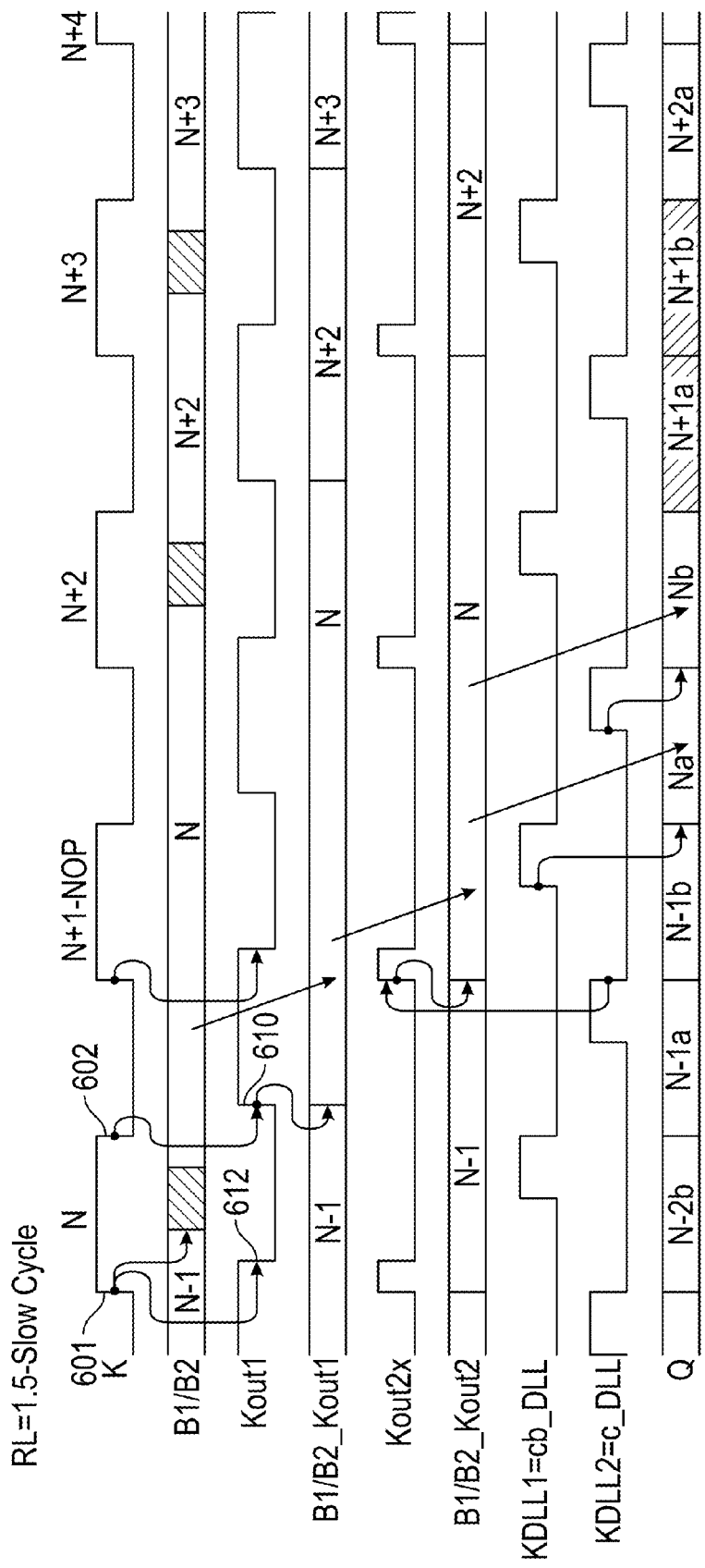

Referring to FIGS. 6A-6B, RL=1.5 may be different from the other RL modes described above in that there is an additional clock, called clock C to control output Q timing. Clock C has an identical clock frequency as clock K, but can be shifted from 0 ns to 0.45*tcyc ns later relative to clock K, where tcyc is the clock cycle time. Cb to Kb delay is same as C to K delay. Instead of aligning to clock K, output Q needs to align to clock C. The address input timing is still referenced to clock K. RL=1.5 is the output Q timing referenced to clock C, and becomes RL=1.5 to 1.95 when it is referenced to clock K. KDLL1 in this mode is a one shot pulse based on Cb_DLL, which is in the range of 0 to 0.45 tcyc away from the Kb rising edge 602. KDLL2 is a one shot pulse based on C_DLL, which is in the range of 0 to 0.45 tcyc away from the K rising edge 601. C_DLL is DLL or PLL clock generated from external C clock, 0=<tKHCH<=0.45 tCYC. Cb_DLL is DLL or PLL clock generated from external Cb clock, 0=<tKHCH<=0.45 tCYC.

Figure 7A:
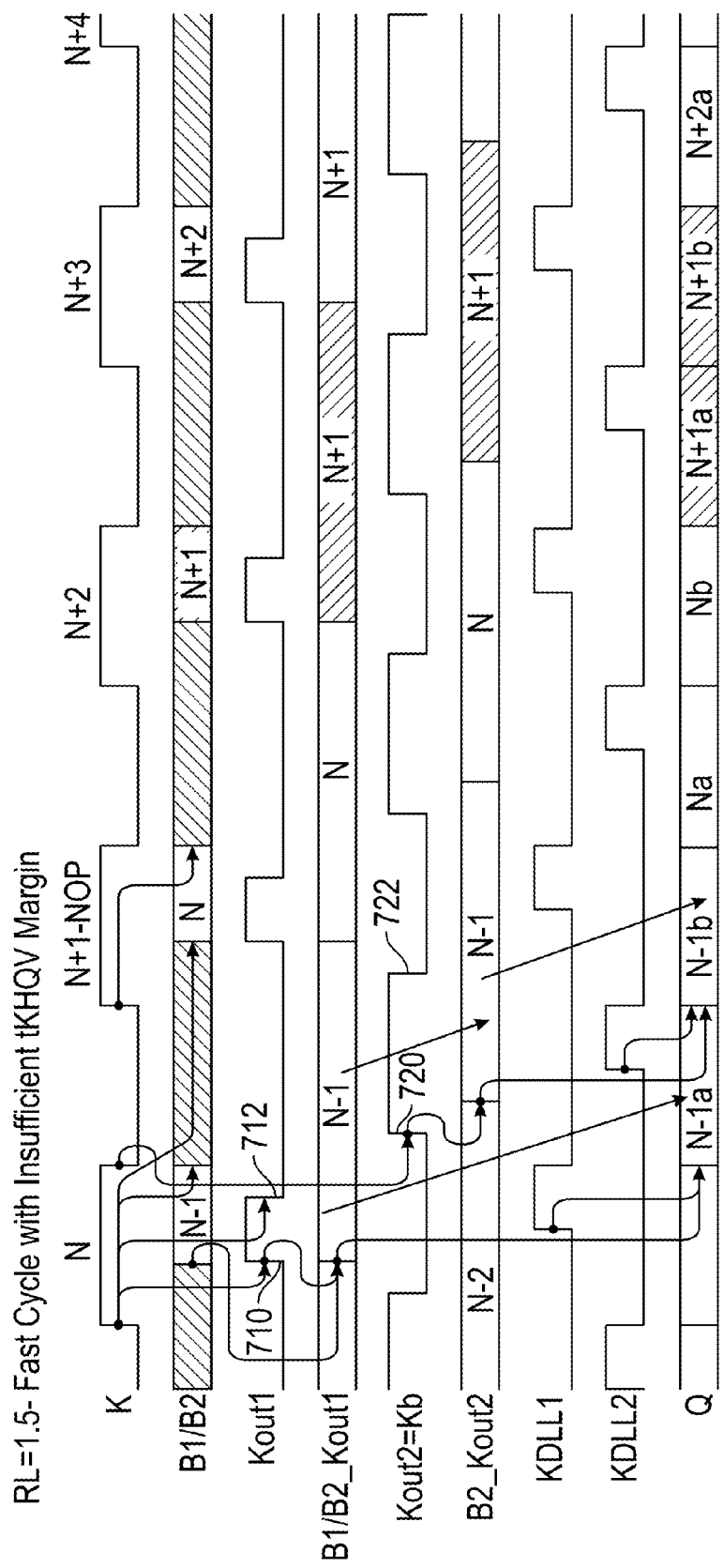
FIGS. 7A-7B are illustrative timing diagrams of RL=1.5 directed to Kout1 aspects, consistent with one or more aspects of the innovations herein.
Figure 7B:
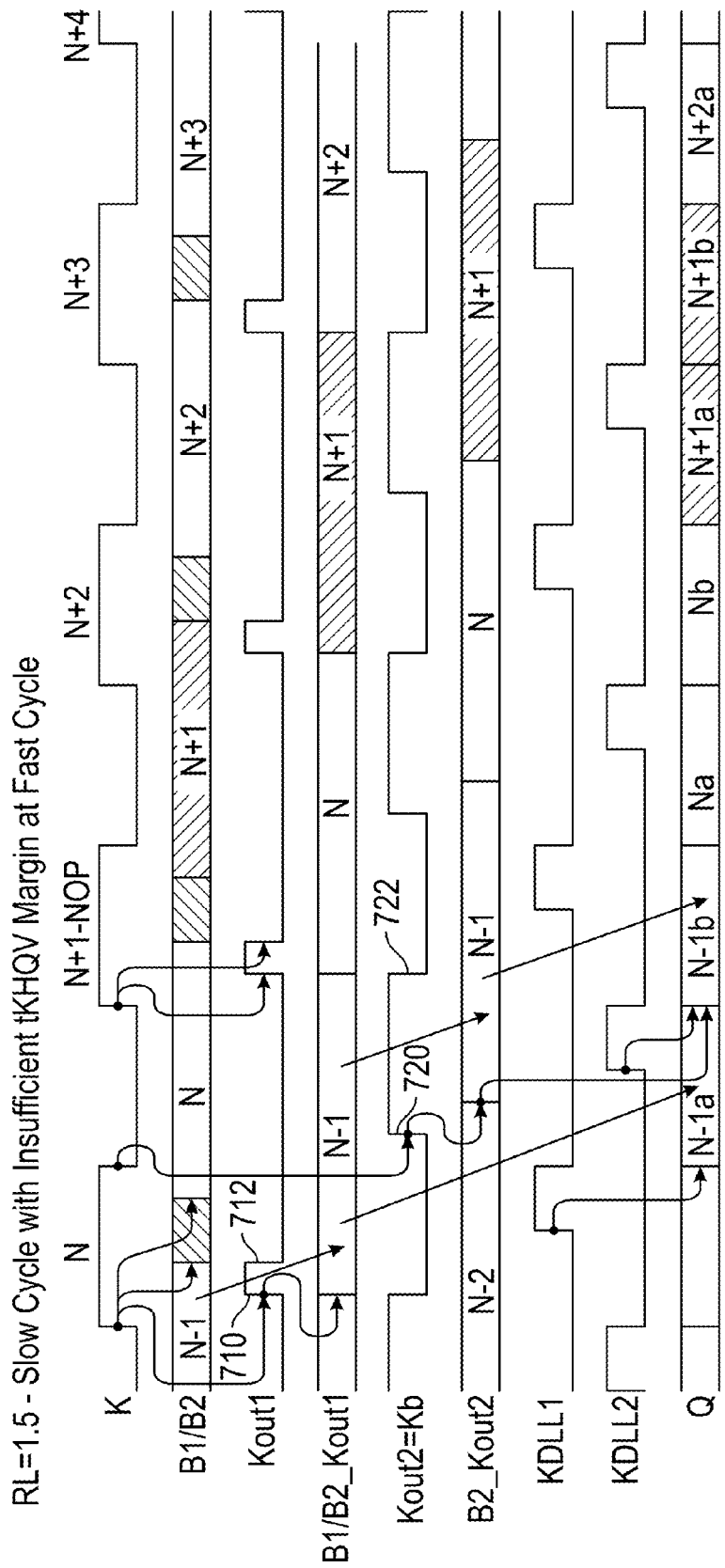

Referring to FIGS. 7A-7B, RL=1.5 also imposes a limitation to Kout1. If Kout1 uses the same scheme of K one shot pulse as RL=2.0 to 3.0, the output path from K external input through Kout1 generator 206 and Output latch 204 to Q output only has 0.5 tcyc available. This 0.5 tcyc K output access time compared to total address access time of 1.5 tcyc is workable, but does not have any margin. However, to provide a wide margin for K output access time, it is preferable to have half of the address access time, such as RL=2.0. To achieve this goal, referring back to FIGS. 6A-6B, Kout1's rising edge 610 is triggered from the K falling edge 602, and Kout1's falling edge may be a delay from the rising edge 601, as long as this delay is equal or less than the sense amplifier SA pre-charge time SAP. In this case, the Kout1 rising edge 610 is triggered from 1 tcyc earlier of output Q, and thus eliminates potential K output access bottlenecks.

In other words, with respect to Kout1, when RL=1.5, the timing is from Delayed Kb, with rising edge from Kb rising, falling edge from K rising. Both Kout1 edges are delayed as long as it is less than the SAP (SA pre-charge) delay. Kout1 rising edge 610 needs to be shorter than it could be so that Q output can be at 1.5 clock cycle.

We can also examine how C clock works when moving from tKHCH=0 to 0.45 tcyc. The timing of Kout21 and Kout22 can be the same and is generated from C_DLL clock and is a one shot pulse from the falling edge of KDLL2. Because Kout1 outputs B1_Kout1 and B2_Kout1 can hold data from 0.5 to 1.5 tcyc, Kout21 and Kout22 can vary from 1 (tKHCH=0) to 1.45 (tKHCH=0.45 tcyc) tcyc to latch B1_Kout1 and B2_Kout1. Kout3 is set high when latch Lat5 is transparent. B1_Kout2 and B2_Kout2 can now hold the data from 1 to 2 (tKHCH=0) or 2.45 (tCKCH=0.45 tcyc) tcyc with some delay, good for the KDLL1 pass gate at 1.5 (tKHCH=0) to 1.95 (tKHCH=0.45 tcyc) tcyc and KDLL2 pass gate at 2.0 (tKHCH=0) 2.45 (tKHCH=0.45 tcyc) tcyc.

Similar to the implementations/configurations for RL=3.0, at the fast cycle, all latches in the path can all be on at the same time to allow data to flow through. However, in the slow cycle, the pipeline is established to allow for RL=1.5.

Similarly for RL=3.0, SA data can be latched around the end of last cycle and the clock cycle time is not limited by output latches. The clock cycle time can be pushed to the minimum that it is limited only by the address access time divided by RL, or read latency.

As in FIG. 2B, 6A, the timing sequence of Kout and KDLL is illustrated below, including the data latched in the cycles:

In the first (B1) data path, provide a KDLL1 (Cb 1 shot from DLL/PLL circuit) pulse 650 to latch cycle (N−1) data 651 from node B1_Kout2 to Q as $1^{st}$ part of output DDR data, (N−1)a 652, aligned to the rising edge of Cb at $2^{nd}$ half of cycle (N). Cb may be a complementary clock of C.

Kout21 pulse 653 is generated from KDLL2 (C 1 shot from DLL/PLL circuit) pulse and is provided to latch cycle (N−1) data 654 from node B1_Kout1 to node B1_Kout2's data 651. KDLL2 is half cycle earlier than KDLL1 and therefore Kout21 is latching data ahead of KDLL1.

As both Kout21 pulse 653 and KDLL1 650 are completed, Kout1 pulse 610 is provided to latch cycle (N) data from SA output B1 657 to node B1_Kout1 658.

In the second (B2) data path, provide a KDLL2 (C 1 shot from DLL/PLL circuit) pulse 660 to latch cycle (N−1) data 651 from node B2_Kout2 to Q as $2^{nd}$ part of output DDR data, (N−1)b 662, aligned to the rising edge of C at the cycle (N+1).

Kout22 pulse 653 is provided before Kout1, to latch cycle (N−1) data from node B2_Kout1 (654) to node B2_Kout2 651.

As Kout22 653 is completed, Kout1 610 is provided to latch cycle (N) data from SA output B2 657 to node B2_Kout1 658.

The timing sequence described can also be described as below:

B1 path: Kout21 pulse complete (N−1)→KDLL1 (Cb_DLL 1 shot) complete (N−1 a)→Kout1 pulse complete (N).

B2 path: Kout22 pulse complete (N−1)→KDLL2 (C_DLL 1 shot) pulse complete (N−1b)→Kout1 pulse complete (N).

Additionally, the following operational information and data is also applicable to implementations consistent with FIGS. 7A-7B:

B1/B2: 2 data outputs from SA 203. Every K cycle, B1/B2 will be pre-charged first and then be valid data. B1/B2 can be extended to the next cycle at fast cycle.

Kout1: The trailing edge 712 is generated from K, tracks and needs to be earlier than SA pre-charge SAP. The beginning edge 710 is also from K with the minimum delay.

Kout2: Rising edge 720 from Kb (complementary K clock) rising, falling edge 722 from K rising. The falling edge 722 needs to be earlier or same as the timing of Kout1's rising edge.

KDLL1: DLL clock to align $1^{st}$ DDR data of Q output to Cb clock rising edge.

KDLL2: DLL clock to align $2^{nd}$ DDR data of Q output to C clock rising edge.

tKHQV critical timing: K→Kout1 rising edge 710→B1_Kout1→Qa, total 0.5 clock cycle.

tKbHQV critical timing: Kb→Kout2 rising edge 720→B2_Kout2→Qb, total 0.5 clock cycle.

tKHQV flow thru critical timing: K(−1)→B1→B1_Kout1→Qa, total 1.5 clock cycle.

KDLL1 is generated from Cb with 0=<tKHCH=<0.45 tCYC, so KDLL1 can be aligning Q to 1.5 to 1.95 tCYC. B1_Kout1 hold time against KDLL1 needs to be 0.45 tCYC more than RL>=2.0.

KDLL2 is generated from C with the same consideration as KDLL1.

Figure 8A:
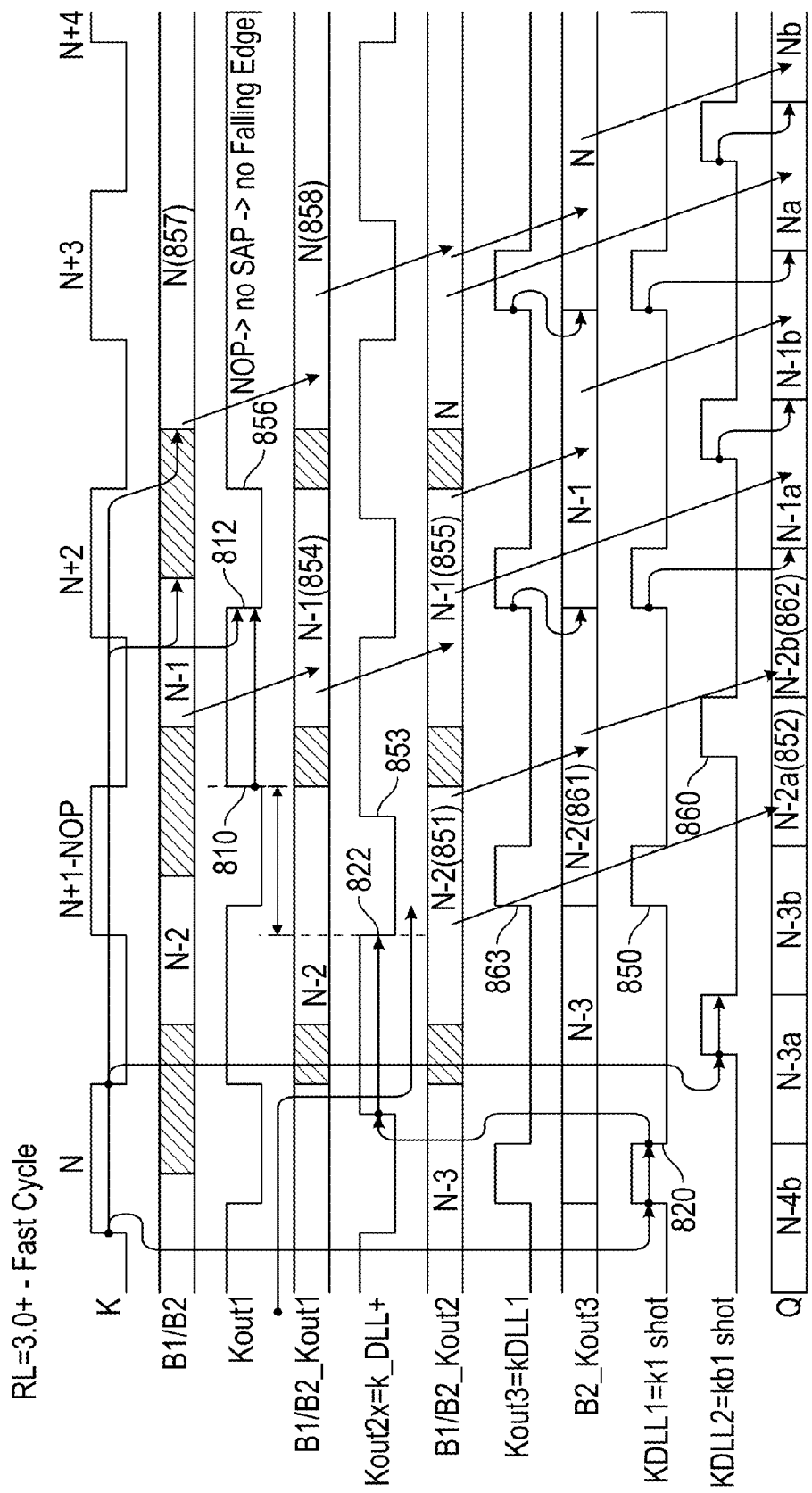
FIGS. 8A-8B are illustrative timing diagrams of RL=3.0+ consistent with one or more aspects of the innovations herein.
Figure 8B:
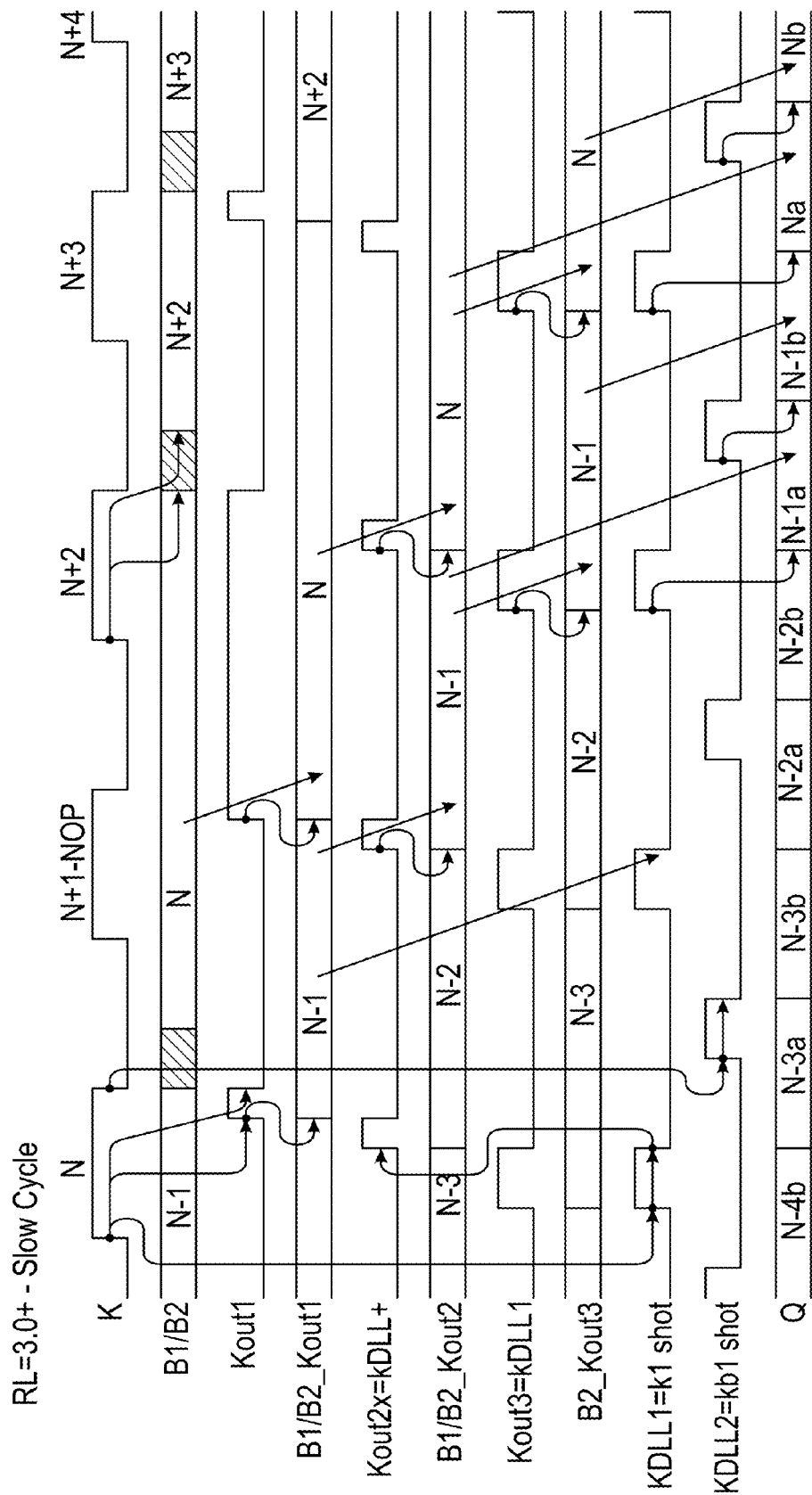

Referring now to FIG. 8A and FIG. 8B for RL=3.0+ operation, RL=3.0+ is the operation without DLL or PLL circuit 207. The Read Latency is still 3, but Q output DDR edges are propagation delayed from K and Kb clock edges, instead of zero delay. Effectively the flow through delay is 3 cycles plus the output delay, the scheme is defined herein as RL=3.0+. In this scheme, K_DLL and Kb_DLL in RL=3.0 design are replaced with a one shot pulse from the rising edges of K and Kb, respectively. Therefore, KDLL1 and KDLL2 are one shot pulses from the rising edges of K and Kb, respectively. The rest of the latches' control signals, Kout1, Kout2 and Kout3 are the same circuit as RL=3.0. With the same design as RL=3.0, Kout1 is a one shot clock from the K rising edge, and with the falling edge tracking SA pre-charge delay SAP and the rising edge 810 is 1 ns earlier than the falling edge 812. Same as RL=3.0, Kout21 and Kout 22 are one shot pulses with the rising edge generated from the falling edge 820 of KDLL1 and the falling edge 822 generated earlier than Kout1 rising edge to latch the outputs of Lat1 and Lat3 and provides a one cycle shift. With the same design as RL=3.0, Kout3 has same timing as KDLL1 and shifts B2_Kout2 to B2_Kout3 for KDLL2 a half cycle later. B1_Kout2 and B2_Kout3 are then multiplexed by KDLL1 and KDLL2 to Q DDR $1^{st}$ and $2^{nd}$ output.

Same as RL=3.0, SA data can be latched around the end of last cycle and the clock cycle time is not limited by output latches. The clock cycle time can be pushed to the minimum that it is limited only by the address access time divided by RL, or read latency.

The timing sequence of Kout and KDLL may thus be the same as RL=3.0 and is shown below, the data latched in which cycle is also shown in parenthesis:

B1 path: KDLL1 (K 1 shot) pulse complete (N−2a)→Kout21 pulse complete (N−1)→Kout1 pulse complete (N).

B2 path: Kout3 pulse complete (N−2)→KDLL2 (Kb 1 shot) pulse complete (N−2b)→Kout22 pulse complete (N−1)→Kout1 pulse complete (N).

Figure 9A:
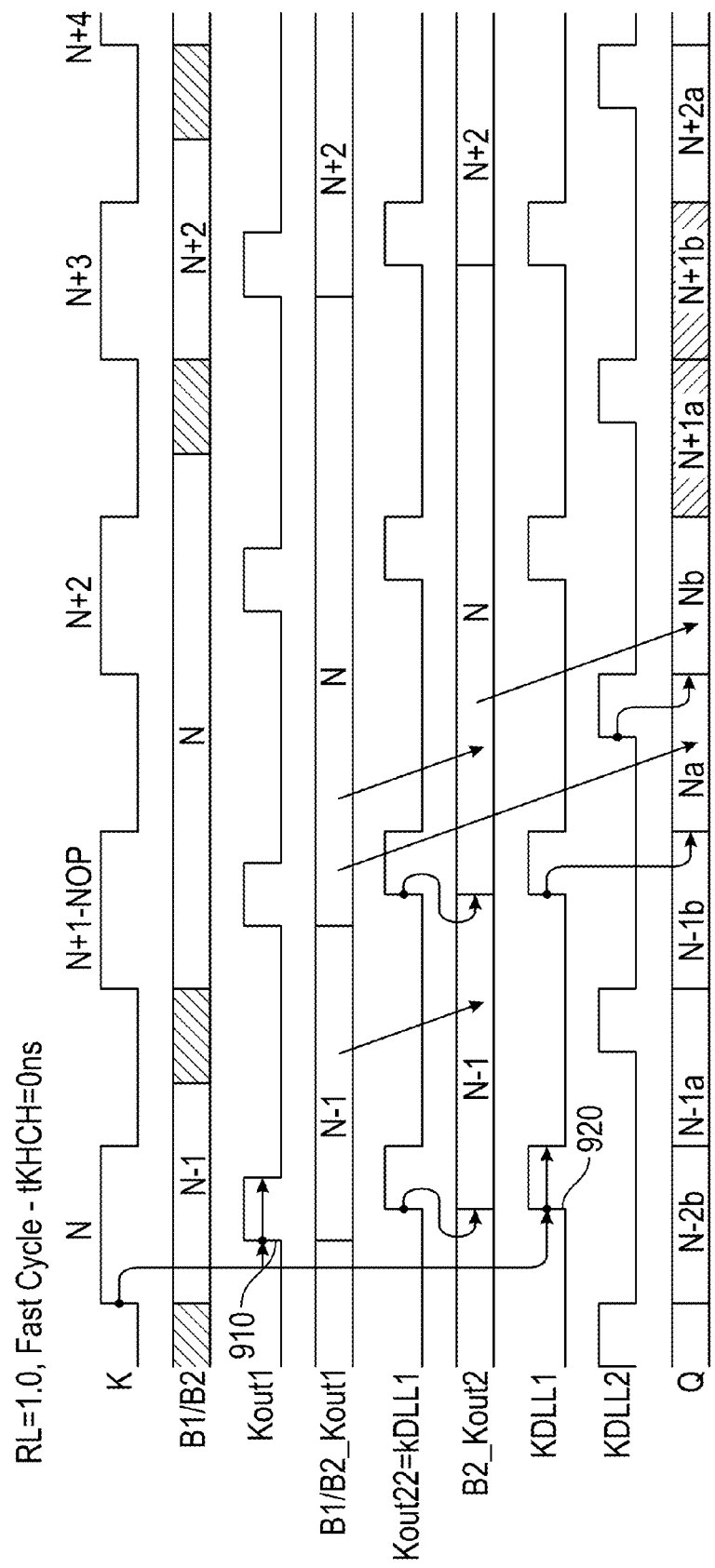
FIGS. 9A-9B are illustrative timing diagrams of DLL=0 mode, consistent with one or more aspects of the innovations herein.
Figure 9B:
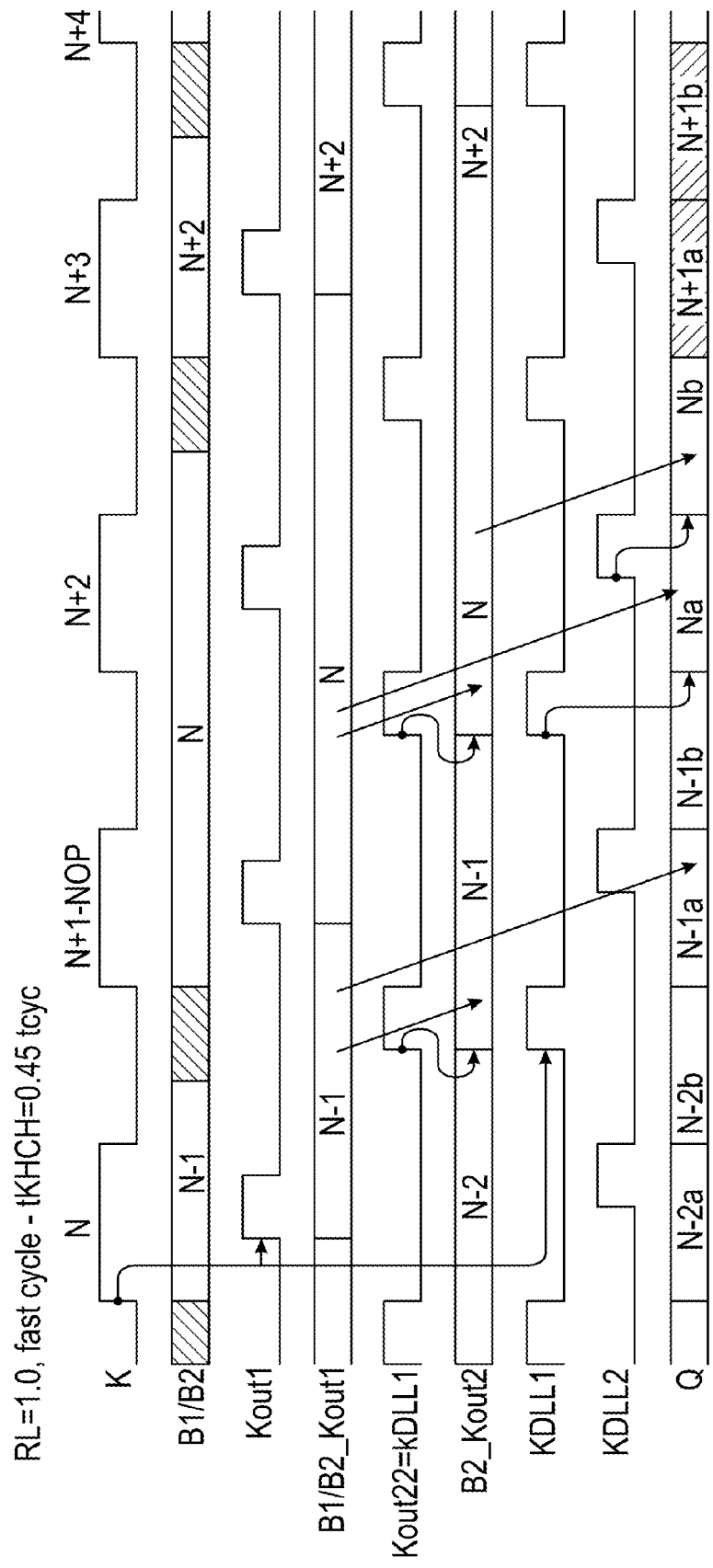

Additionally, systems and methods herein may be configured with various operational aspects relating to a specific configuration or operation, such as delay lock loop operation. Here, for example, implementations may include a control pin named as DLL (FIG. 2A), and when DLL=1, the circuit operations of RL=1.5-3.0 are operated as described above. A DLL=0 mode operates the circuit as if RL=1.0, but Q DDR outputs are the propagation delay from K and Kb edges, instead of aligned to the edges. The output path is set to be same as RL=2.0, with Kout1 and Kout3 biased to be high. Kout1 is a one shot signal generated from the K rising edge with minimum delay and also minimum pulse width. KDLL1 is a one shot pulse generated from K or C rising edge with the rising edge 920 a slight delay than the Kout1 rising edge 910 to account for the delay of LAT1 and LAT2. KDLL2 is a one shot pulse generated from Kb or Cb rising edge with the same delay from the clock edge as KDLL1. C and Cb with tKHCH=0 to 0.45 tcyc are used when RL=1.5. Kout22 is a one shot signal with the same timing as KDLL1, the same design as RL=2.0, DLL=1. The waveforms are illustrated in FIGS. 9A and 9B.

The Same Stage of Latch of B1 and B2 Paths has the Same Latch Control Timing

For B1 and B2 paths, Lat1 and LAT3 are on the $1^{st}$ stage and are active at all RL, B1 and B2 are the same timing, therefore the latch control of LAT1 and Lat3 is the same with Kout1. At RL=1.5, 2.5, 3.0 and 3.0+, LAT2 and LAT4 are active and on the $2^{nd}$ stage, the timing of B1_Kout1 and B2_Kout2 is the same, therefore the latch control Kout22 is same as Kout21.

The Control Timing of Last Extra Latch of B2 Path is Same as KDLL1

The last extra latch of B2 path before the final multiplexer is to latch the data so KDLL2 can multiplex B2 data half cycle later than KDLL1. For design simplicity, the latch timing of the last extra latch is same as KDLL1 because the latching requirement is same. At RL=2.0 and DLL=0 (RL=1.0), Lat2 is biased high and the last extra latch is Lat4, Kout 22 timing is same as KDLL1. At RL=2.5, 3.0 and 3.0+, the last extra latch is Lat5, Kout3 timing is same as KDLL1. The multiplexer and latch controlled by KDLL1 can add a complementary latches for register and multiplexer function, Lat5 can also be converted to a register controlled by Kout3; this register is then either registered by KDLL1 at RL=2.5 to 3.0+, or in bypass mode at RL1.0 to 2.0. At RL=1.5 case, B1 and B2 have the same number of stage of latches, 2, there is no such last extra latch of B2.

Latch Timing Sequence

Innovations herein may relate to aspects of latch/register timing sequence, such as methods of memory operation involving the latch timing sequencing herein and devices including and/or involving control circuitry that provides control signals along control lines to the latches/registers to provide such latch timing sequencing features. In implementations herein, for example, except when RL=1.5, KDLL2 may be set a half cycle later than Kout3, or a half cycle later than Kout22 when Kout3 is biased high, with the latter stage latch timing being earlier than the previous stage. For example, when RL=3.0, on B1 path, KDLL1 is earlier than Kout21 and Kout 21 is earlier than Kout1; on B2 path, KDLL2 provides half cycle shift and is half cycle later than Kout3, however, Kout3 is earlier than Kout22 and Kout22 is earlier than Kout1. According to such arrangements, the latches except KDLL2 provide 1 cycle delay to establish the proper pipeline order.

KDLL1 and KDLL2 Register Operation

Innovations herein may also relate to aspects of the pass gates, including the configuration of pass gates such as KDLL1 and KDLL2. For example, the KDLL1 and KDLL2 pass gates (FIG. 2B) are shown and described as latches. Consistent with some systems and methods, however, the latches may be converted to a register by adding a latch in front with inverted control (i.e. KDLL1$b$ and KDLL2$b$). In certain implementations, utilizing such register design for KDLL1 and/or KDLL2 provides more precise output Q timing with one extra latch delay on the data path.

Figure 10:
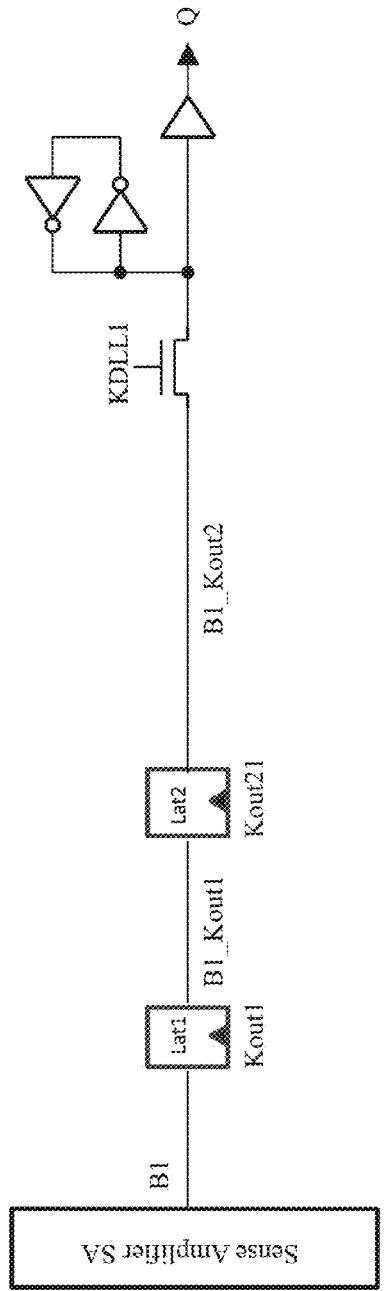
FIG. 10 is a block diagram of an illustrative single data rate output path features of exemplary memory devices consistent with one or more aspects of the innovations herein.
Figure 11:
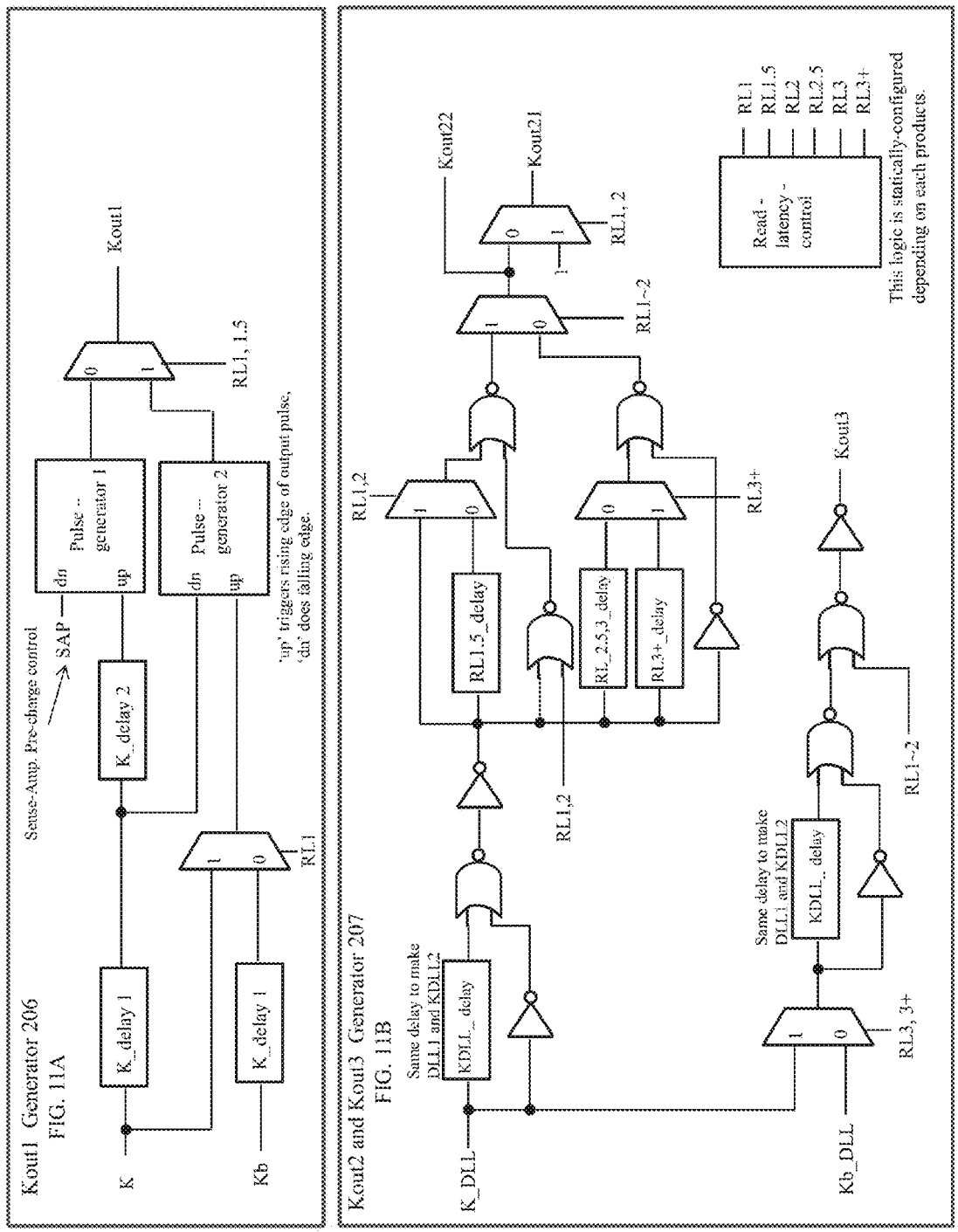
FIGS. 11A-11B are block diagram of illustrative pipelined output latch features of exemplary memory devices consistent with one or more aspects of the innovations herein.
Figure 12:
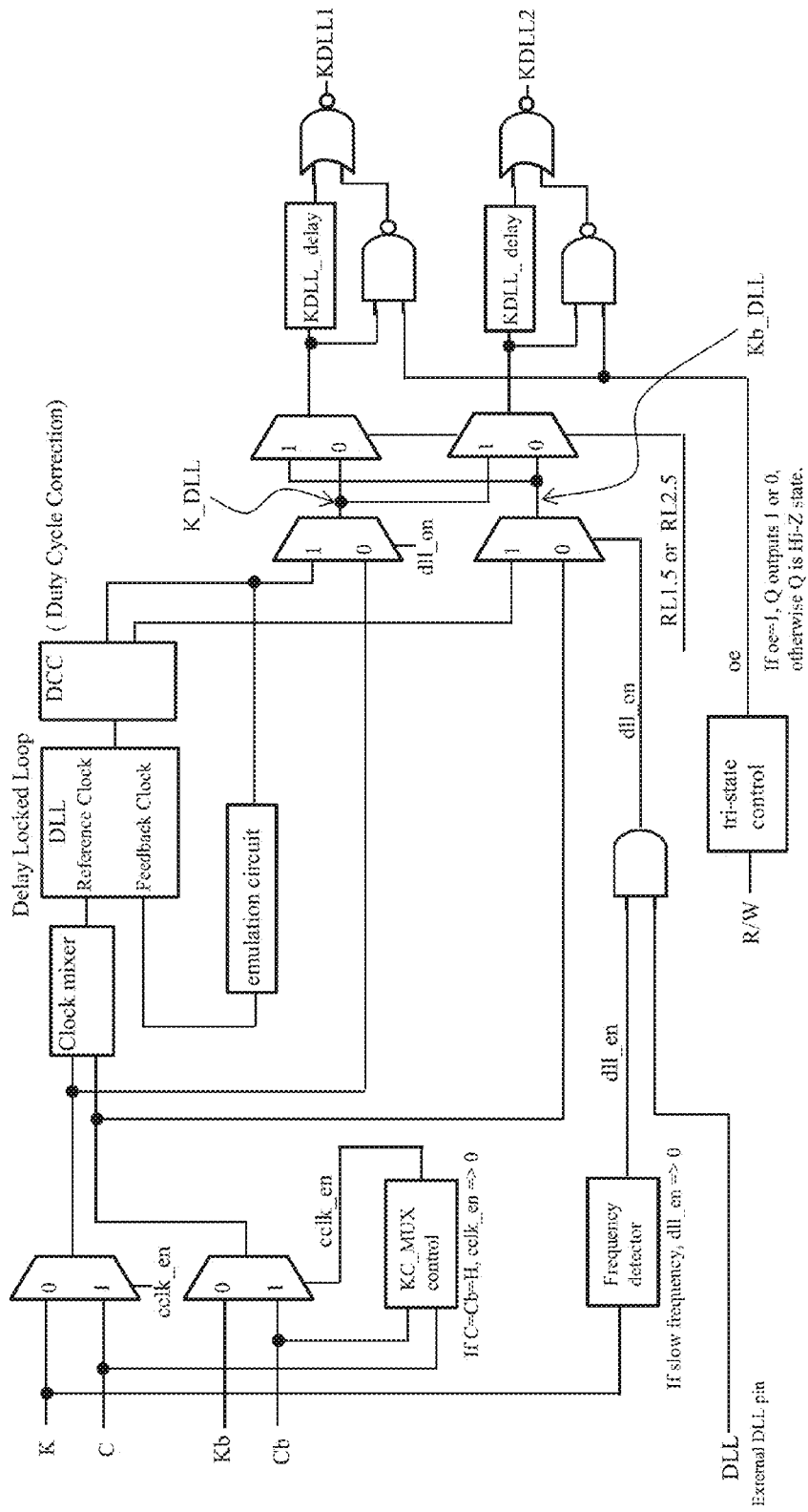
FIG. 12 is a block diagram of illustrative pipelined output latch features of exemplary memory devices consistent with one or more aspects of the innovations herein.

To measure Flow Thru speed, a test Flow Thru (FT) mode may be considered such that FT mode is entered with slow frequency. For DLL=0, all Kouts=1, KDLL1=K, KDLL2=KDLL1$b$. This is equivalent to RL=0. The expected tcycmin=2*FT delay=2*4.5 ns=9 ns SDR (Single Data Rate) is Same as B1 Path Aspects of the innovations herein may also be applied to SDR (Single Data Rate) with the same RL consideration(s). The output Q of SDR memory chip has one data per clock cycle. So RL and output timing may be the same as the B1 path. FIG. 10 shows the SDR output path with various RL, utilizing the same B1 path as certain of the DDR output implementations shown and described herein.

Data Path Innovation and Circuitry/Fabrication Simplicity

As set forth above, synchronous memory devices are disclosed herein having data paths of reduced complexity and cost, including a minimal number of registers/latches and associated delays. For example, SRAM devices are provided comprising memory circuitry having a memory output (Q) and including a sense amplifier having a first output and a second output, a first data path (B1) coupled to the first output of the sense amplifier, the first data path consisting of only 2 latches/registers, and a second data path (B2) coupled to the second output of the sense amplifier, the second data path consisting of only 3 latches/registers. Additionally, with regard to some further embodiments, it is noted that such present designs of reduced complexity may also be described or qualified as pertaining to registers/latches that are substantively involved with achieving read latency modes of operation. Here, for example, present inventions may be characterized this way because similar devices might be pursued based on the innovations herein, though designed to have more than 2 or 3 registers/latches in the data paths, while in essence utilizing the principles herein (and, e.g., just adding some dummy registers/latches of de minimus contribution). In view of this, inventions herein may also be characterized as consisting of 2 or 3 latches/registers that are "substantively involved with achieving read latency modes of operation." Here, such substantive contribution may be characterized by one or more operational qualities of the registers/latches, such as involvement of the register/latch in one or more of the read latency modes beyond operation of de minimus delay compared to delay of the previous register/latch or other register (s)/latche(s) in the data path, involvement of the register/latch in one or more of the read latency modes characterized in that either use and/or non-use of the register/latch is essential to provision of at least one of the read latency modes, involvement of the register/latch in one or more of the read latency modes characterized in that either use or non-use of the register/latch directly effects achieving operation of at least one of the read latency modes, and/or involvement of the register/latch such that, when in use, the register/latch provides approximate magnitude of delay as other register(s)/latch(es) being utilized to provide the data path output. To put this another way, inventions drawn to the 2 or 3 registers/latches in the data paths may relate to the core operational innovations herein, such that they are not avoided by simply adding latches/registers of trivial behavior to the core innovation(s).

In addition to the illustrative innovations and architecture described above, the present inventions may also include, inter alia, methods of memory operation, methods of fabricating memory devices consistent with the features and/or functionality herein, products, and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of such forms. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations associated with the innovations or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with innovations herein, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types.

The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the inventions have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A method for synchronous memory operation, the method comprising:
   providing outputs from a sense amplifier to a first data path having two latches and/or registers and to a second data path having three latches and/or registers;
   operating the latches and/or registers in the first and second data paths according to specified configurations, control, modes, latency and/or timing domain information; and
   merging the first data path and the second data path to provide a double data rate output;
   wherein memory and/or control circuitry associated with the synchronous memory is configured to provide pipelined output latching via circuit configuration(s) and/or a plurality of modes of operation.

2. The method of claim 1 further comprising:
   aligning an output of the memory circuitry to an external or input clock.

3. The method of claim 1 wherein the merging of data from the first data path and the second data path is performed via a multiplexer and another latch and/or register.

4. The method of claim 1 further comprising:
   in the first data path:
      providing a KDLL1 (K 1 shot from DLL/PLL circuit) pulse to latch cycle (N−2) data from node B1_Kout2 to Q as first part of output DDR data, (N−2)a, aligned to the rising edge of K at cycle (N+1);
      as the KDLL1 pulse is completed, providing Kout21 pulse to latch cycle (N−1) data from node B1_Kout1 to node B1_Kout2's data;
      as Kout21 pulse is completed, provide a Kout1 pulse to latch cycle (N) data from SA output B1 to node B1_Kout1; and
   in the second data path:
      providing a KDLL2 (Kb 1 shot from DLL/PLL circuit) pulse to latch cycle (N−2) data from node B2_Kout3 to Q as a second part of output DDR data, (N−2)b, aligned to the rising edge of Kb at the second half of cycle (N+1);
      providing a Kout3 pulse with the same timing as KDLL1, being a half cycle phase shifted before KDLL2;
      as Kout3 pulse is completed, providing a Kout22 pulse to latch cycle (N−1) data from node B2_Kout1 to node B2_Kout2; and
      as Kout22 is completed, providing a Kout1 pulse to latch cycle (N) data from SA output B2 to node B2_Kout1.

5. The method of claim 1 further comprising:
   in the first data path:
      providing a KDLL1 (Kb 1 shot from DLL/PLL circuit) pulse to latch cycle (N−2) data from node B1_Kout2 to Q as a first part of output DDR data, (N−2)a, aligned to the rising edge of Kb at a second half of cycle (N);
      as KDLL1 pulse is completed, providing a Kout21 pulse to latch cycle (N−1) data from node B1_Kout1 to node B1_Kout2's data;
      as Kout21 pulse is completed, providing a Kout1 pulse to latch cycle (N) data from SA output B1 to node B1_Kout1;
   in the second data path:
      providing a KDLL2 (K 1 shot from DLL/PLL circuit) pulse to latch cycle (N−2) data from node B2_Kout3 to Q as a second part of output DDR data, (N−2)b 462, aligned to the rising edge of K at the cycle (N+1);
      providing a Kout3 pulse with the same timing as KDLL1, being a half cycle phase shifted before KDLL2, to latch cycle (N−2) data from node B2_Kout2 to node B2_Kout3;
      as Kout3 pulse is completed, providing a Kout22 pulse to latch cycle (N−1) data from node B2_Kout1 to node B2_Kout2; and
      as Kout22 is completed, Kout1 is provided to latch cycle (N) data from SA output B2 to node B2_Kout1.

6. The method of claim 1 further comprising:
   in the first data path:
      providing a KDLL1 (K 1 shot from DLL/PLL circuit) pulse to latch cycle (N−1) data from node B1_Kout1 to Q as a first part of output DDR data, (N−1)a, aligned to the rising edge of K at cycle (N+1);
      as KDLL1 pulse is completed, providing a Kout1 pulse to latch cycle (N) data from SA output B1 to node B1_Kout1;
   in the second data path:
      providing a KDLL2 (Kb 1 shot from DLL/PLL circuit) pulse to latch cycle (N−1) data from node B2_Kout2 to Q as a second part of output DDR data, (N−1)b, aligned to the rising edge of Kb at the second half of cycle (N+1);
      providing a Kout22 pulse with the same timing as KDLL1, being a half cycle phase shifted before KDLL2, to latch cycle (N−1) data from node B2_Kout1 to node B2_Kout2; and as Kout22 is completed, providing a Kout1 pulse to latch cycle (N) data from SA output B2 to node B2_Kout1.

7. The method of claim 1 further comprising:

in the first data path:

providing a KDLL1 (Cb 1 shot from DLL/PLL circuit) pulse to latch cycle (N−1) data from node B1_Kout2 to Q as a first part of output DDR data, (N−1)a, aligned to the rising edge of Cb at a second half of cycle (N);

providing a Kout21 pulse to latch cycle (N−1) data from node B1_Kout1 to node B1_Kout2's data;

once both Kout21 pulse and KDLL1 pulse are completed, providing Kout1 pulse to latch cycle (N) data from sense amplifier output B1 to node B1_Kout1;

in the second data path:

providing a KDLL2 pulse to latch cycle (N−1) data from node B2_Kout2 to Q as a second part of output DDR data, (N−1)b, aligned to the rising edge of C at the cycle (N+1);

providing a Kout22 pulse before Kout1, to latch cycle (N−1) data from node B2_Kout1 to node B2_Kout2; and upon completion of Kout22 pulse, providing a Kout1 pulse to latch cycle (N) data from SA output B2 to node B2_Kout1.

8. A method for providing pipelined output latching of synchronous memory circuitry, the method comprising:

outputting by a sense amplifier to a first data path with a read output latency of at least 1.5, wherein the first data path includes a plurality of latches and a timing of the plurality of latches overlap according to a high frequency operation.

9. A method for providing output latching of synchronous memory circuitry, the method comprising:

outputting data from a sense amplifier to a first data path and to a second data path;

in connection with the memory circuitry being configured such that the first data path and the second data path each include a plurality of latches and/or registers, controlling a first latch and/or register of the first data path via first timing domain information; and controlling a second register and/or latch in the first data path serially connected to an output of the first latch; and controlling the second register and/or latch via second timing domain information;

merging first data path and the second data path for double data rate output;

such that pipelined output latching is provided via a plurality of read output latency modes of operation.

10. The method of claim 9 further comprising:

aligning by clock alignment circuitry an output of the memory circuitry to an external or input clock edge via timing domain information.

11. The method of claim 9 with respect to read latency (RL), wherein a number of registers and/or latches of the first data path is equal to RL−1, where RL is the read output latency greater than three.

12. The method of claim 9, wherein a number of registers and/or latches of the first data path is equal to one for a read output latency of two or less.

13. The method of claim 9, wherein a number of latches of the first data path is equal to two for a read output latency of 2.5 and 3.

14. The method of claim 9 wherein the first data path comprises two latches and the second data path comprises two latches followed by one register at an end.

15. The method of claim 9 wherein, as a function of the operating of the first register or latch, a window for latching is extended to include latching on a first cycle and out beyond the first cycle.

16. The method of claim 9 wherein, as a function use of a sense amplifier tracking delay signal as input to the first register or latch, data from the sense amplifier is available over a longer availability data window to the circuitry of the data paths.

17. The method of claim 9 wherein, as a function of data from the sense amplifier being provided for a longer availability data window via use of the sense amplifier tracking delay signal as input to the first register or latch, time period for latching outputs to the double data rate output is extended to include latching on a first cycle and out beyond the first cycle.

18. The method of claim 9 wherein the first register or latch in the first data path is operated as a function of a sense amplifier tracking delay signal, independent of cycle time, for all levels of read latency.

19. The method of claim 9 wherein the first register or latch in the first data path is operated via an input receiving a sense amplifier tracking delay signal, to extend availability of data from the sense amplifier, such that a window for latching previous cycle data (N−1) is extended to include latching on a first cycle (N) and out beyond the first cycle (N+1).

20. The method of claim 9 wherein a sense amplifier tracking delay signal is utilized to latch the previous cycle data independent of the cycle time.

* * * * *